United States Patent
Xiao et al.

(10) Patent No.: US 9,685,950 B2
(45) Date of Patent: Jun. 20, 2017

(54) ENERGY-SAVING ELECTRONIC TOUCH SWITCH

(75) Inventors: Xingchao Xiao, Shenzhen (CN); Qingguang Lin, Shenzhen (CN); Caihong Yan, Shenzhen (CN)

(73) Assignee: SHENZHEN ADA ELECTRONICS CO., LTD., Shenzhen (CN)

( * ) Notice: Subject to any disclaimer, the term of this patent is extended or adjusted under 35 U.S.C. 154(b) by 940 days.

(21) Appl. No.: 14/005,505

(22) PCT Filed: Mar. 16, 2012

(86) PCT No.: PCT/CN2012/072490
§ 371 (c)(1),
(2), (4) Date: Sep. 16, 2013

(87) PCT Pub. No.: WO2012/126337
PCT Pub. Date: Sep. 27, 2012

(65) Prior Publication Data
US 2014/0001885 A1  Jan. 2, 2014

(30) Foreign Application Priority Data

Mar. 23, 2011 (CN) .................... 2011 2 0078291 U
Mar. 30, 2011 (CN) .................... 2011 1 0078348
(Continued)

(51) Int. Cl.
*H01H 35/00* (2006.01)
*H01H 83/00* (2006.01)
(Continued)

(52) U.S. Cl.
CPC ......... *H03K 17/962* (2013.01); *H03K 17/725* (2013.01); *H03K 17/7955* (2013.01); *Y10T 307/766* (2015.04)

(58) Field of Classification Search
CPC .. H03K 17/962; H03K 17/725; H05B 39/085; Y10T 307/937; Y10T 307/766; H02K 17/7955
See application file for complete search history.

(56) References Cited

U.S. PATENT DOCUMENTS 5,783,875 A * 7/1998 Jaros .................... H03K 17/962
307/116
7,466,040 B2  12/2008 Bruwer

FOREIGN PATENT DOCUMENTS

CN     201039120     3/2008
CN     101384122     3/2009
(Continued)

OTHER PUBLICATIONS

International Search Report for CPT/CN2012/072490 dated Jun. 24, 2012. 2 pages.

*Primary Examiner* — Rexford Barnie
*Assistant Examiner* — Rasem Mourad
(74) *Attorney, Agent, or Firm* — Hamre, Schumann, Mueller & Larson, P.C.

(57) ABSTRACT

The present invention discloses an energy-saving electronic touch switch, comprising a touch sensing module, a power supply module and a switch driving module, wherein the touch sensing module is used for receiving a touch sensing signal inputted by a capacitive touch switch, and controlling the action of the switch driving module according to the touch sensing signal, so as to switch on a power supply circuit for the load; and the power supply module feeds power to the touch sensing module. The touch switch can drive various loads and has a wider range of possible loads including inductive, capacitive or purely resistive loads and high-frequency switch power supply loads, such as energy-saving lights, AC (Alternating Current) motors, LEDs (Light Emitting Diodes) new light sources, common fluorescent
(Continued)

lamps, and the like. The energy-saving electronic touch switch overcomes the disadvantages of small load range and weak load capacity of conventional switches. The energy-saving electronic touch switch employs chips with low power consumption such as LDO (Low Dropout Regulator) voltage regulator chips, touch chips, and the like, which can reduce the overall power consumption, wherein the overall power consumption is less than 2.2 mW and the single static overall power consumption is less than 10 mW (measured under an indicator lamp). The energy-saving electronic touch switch simplifies circuits and improves the power supply utilization rate.

19 Claims, 12 Drawing Sheets

(30) Foreign Application Priority Data

| Apr. 6, 2011 | (CN) | 2011 2 0098190 U |
| Jun. 21, 2011 | (CN) | 2011 2 0211343 U |
| Sep. 30, 2011 | (CN) | 2011 2 0374439 U |
| Dec. 20, 2011 | (CN) | 2011 2 0534899 U |
| Dec. 20, 2011 | (CN) | 2011 2 0534936 U |

(51) Int. Cl.
*H03K 17/96* (2006.01)
*H03K 17/725* (2006.01)
*H03K 17/795* (2006.01)

(56) References Cited

FOREIGN PATENT DOCUMENTS

| CN | 102130674 | 7/2011 |
| CN | 201956995 | 8/2011 |
| CN | 202009376 | 10/2011 |
| CN | 202094865 | 12/2011 |
| EP | 1675262 | 6/2006 |

\* cited by examiner

ENERGY-SAVING ELECTRONIC TOUCH SWITCH

FIELD OF THE INVENTION

The present invention discloses a touch switch, and in particular, to an energy-saving electronic touch switch.

BACKGROUND OF THE RELATED ART

At present, most alternating current switches in the market are mechanical type key switches which needs to be pulled manually so as to implement switching on and off of a control circuit; the mechanical type key switches have many inconveniences on operation; moreover, the quality and service lives of the switches cannot be guaranteed; meanwhile, the mechanical type key switches also have problems such as mechanical wear and sparks occurred during switching on and off, and the like, and are not applicable to certain occasions such as inflammable, explosive and coal gas leaking rooms, etc. In this case, electronic type switches such as touch switches, voice operated switches and vibroswitchs which do not cause dangerous situations such as sparks during the on and off process are produced. However, the existing popular electronic touch switches can only be used for controlling filament lamps usually due to high power consumption thereof. Moreover, the existing popular electronic touch switches cannot control inductance type fluorescent lamps, low power consumption (usually the power is less than 5 W) LED (Light Emitting Diode) lamps and inductance type loads thereof (such as a low power consumption motor). Meanwhile, multi-circuit control cannot be implemented on one switch box of the existing electronic switch; moreover, the touch method of the existing electronic switch is metal contact which is lack of sense of safety. All the touch switches in the prior art only have single-point on-off control function, which has many inconveniences on application. The electronic switches at present do not have the output detection function generally, are easy to cause danger while outputting over-voltage and over-load, and have hidden safety troubles.

DISCLOSURE OF THE INVENTION

Summary of the Invention

Aiming at the defect of the touch switch in the prior art which is not safe enough abovementioned, the present invention provides a novel energy-saving electronic touch switch, which employs capacitance touch as a touch single, and stops a user from an opportunity of contacting high voltage, so that the user is safer.

The technical solution employed by the present invention to solve the technical problems thereof is that: an energy-saving electronic touch switch comprises a touch sensing module, a power supply module and a switch driving module, wherein the touch sensing module is used for receiving a touch sensing signal inputted by a capacitive touch switch, and controlling the action of the switch driving module according to the touch sensing signal, so as to switch on a power supply circuit for the load; and the power supply module feeds power to the touch sensing module.

The technical solution adopted by the present invention to solve the technical problems thereof further includes the steps as follows:

The switch driving module comprises magnetic latching relays and switch driving elements, and the touch sensing module controls the switching on and off of the switch driving elements.

The quantity of the switch driving elements is twice of that of the magnetic latching relays; two switch driving elements are respectively connected onto the two control terminals of one magnetic latching relay; and the switch driving elements control the magnetic latching relays to work.

The energy-saving electronic touch switch further comprises load detecting modules, wherein the load detecting module switches detect the voltages outputted by the switch driving module and feed back to the touch sensing module; more than one load detecting module is arranged; and each load detecting module detects the voltage outputted by one switch driving module and feeds back to the touch sensing module.

The load detecting module employs divider resistances that are connected in series; one terminal of the divider resistance is connected with the output terminal of the switch driving module; the other terminal of the divider resistance is grounded; and the common terminal of the divider resistance is connected with the touch sensing module.

The energy-saving electronic touch switch further comprises a feeder unit, wherein the feeder unit comprises a voltage stabilizing diode and a rectifying unit; the voltage stabilizing diode is connected onto the control terminal of a bidirectional triode thyristor and outputs to the rectifying unit, and the rectifying unit after rectifying outputs to the power supply module.

The feeder module comprises an operational amplifier U3, a switching tube Q3 and an audion Q4, wherein the output terminal of the power supply module is connected with the inverting input terminal of the operational amplifier U3; the non-inverting input terminal of the operational amplifier U3 is grounded via a resistance R13; the output terminal of the operational amplifier U3 is connected onto the control terminal of the switching tube Q3; the switching tube Q3 is connected with a live wire of commercial power in series; the external side terminal of the switching tube Q3 is grounded; the output terminal of the operational amplifier U3 is connected with a base of the audion Q4 via a resistance R10; the audion Q4 is connected onto the inverting input terminal of the operational amplifier U3 via a resistance R17; a relay switch and driving module is connected onto the input terminal of a voltage regulator chip U2 via a diode D5, a diode D4 and a diode D3 successively connected in series; a feeder filter capacitor C10 and a feeder filter capacitor C11 are respectively connected between the two terminals of the diode D4 and the ground; a voltage stabilizing diode ZD3 is connected between the common terminal of the diode D5 and the diode D4 and the control terminal of the switching tube Q3; and a voltage stabilizing diode ZD2 is connected between the common terminal of the diode D5 and the diode D4 and the non-inverting input terminal of the operational amplifier U3.

The energy-saving electronic touch switch according to claim 1, wherein the power supply module comprises a rectifying bridge group, a transformer and a voltage regulator chip; the rectifying bridge group obtains power from the switch driving module and outputs the power to the transformer; then the transformer outputs the power to the voltage regulator chip, and the voltage regulator chip outputs the power to a relay and driving module and the touch sensing module to feed power.

The energy-saving electronic touch switch further comprises a battery module, wherein the power supply module can charge the battery module and the battery module can feed power to the relay and driving module and the touch sensing module.

The power supply module further comprises a voltage detecting chip; the voltage detecting chip detects the voltage of the battery module and outputs a detection result to the touch sensing module.

The output of the secondary main coil of the transformer is connected with a resistance R5, a voltage stabilizing diode ZD1 and a light emitting diode of an optocoupler OP0 that are connected in series.

The power supply module further comprises a feedback unit; the feedback unit comprises the optocoupler and the voltage stabilizing diode; the voltage stabilizing diode is connected onto a secondary coil of the transformer to sample the output voltage of the secondary coil of the transformer and output a sampling result to the light emitting diode in the optocoupler; and a phototriode in the optocoupler outputs to the control terminal of the switching tube so as to control the switching on and off of the switching tube.

The energy-saving electronic touch switch further comprises a state indicating module used for indicating work of the power supply module, wherein the state indicating module is connected with the output terminal of the power supply module.

The state indicating module of the energy-saving electronic touch switch comprises three red LEDs (Light Emitting Diodes) and three white LEDs (Light Emitting Diodes), and the six LEDs (Light Emitting Diodes) are respectively connected onto the output terminal of the touch sensing module.

A rectifying bridge group comprises three rectifying bridges (namely, BD1, BD2 and BD3); the two rectifying bridges are connected in parallel to output to a transformer; the positive output terminals of the rectifying bridge BD1, the rectifying bridge BD2 and the rectifying bridge BD3 are connected with a phototriode in an optocoupler OP0 after passing through a current limiting resistance R1, a resistance R2 and a resistance R3 which are connected in series; the common point of the current limiting resistance R1, the resistance R2 and the resistance R3 which are connected in series, and the phototriode in the optocoupler OP0 is connected with the base of an audion Q1; the audion Q1 is connected between another primary input terminal of a transformer T and the ground in series; a filter capacitor C1 is connected onto the common terminal of the resistance R1 and the transformer T; a resistance R4 and a capacitor C2 are connected between the phototriode in the optocoupler OP0 and the secondary coil of the transformer T in series; the resistance R4 and the capacitor C2 form an RC (Resistance-Capacitance) oscillator; the other terminal of the phototriode in the optocoupler OP0 is grounded via a capacitance C3; meanwhile, the other terminal of the phototriode in the optocoupler OP0 is connected onto the secondary coil of the transformer T via a diode D1; and the output of the secondary main coil is outputted to the touch sensing module and the relay and driving module to feed power via a rectifying diode D2 and a diode D4.

A rectifying bridge group comprises three rectifying bridges (namely, BD1, BD2 and BD3); the three rectifying bridges are connected in parallel to output to a transformer; the positive output terminals of the rectifying bridge BD1, the rectifying bridge BD2 and the rectifying bridge BD3 are connected with a phototriode in an optocoupler OP0 after passing through a current limiting resistance R1, a resistance R2 and a resistance R3 which are connected in series; the common point of the current limiting resistance R1, the resistance R2 and the resistance R3 which are connected in series, and the phototriode in the optocoupler OP0 is connected with the base of an audion Q1; the audion Q1 is connected between another primary input terminal of a transformer T and the ground in series; a filter capacitor C1 is connected onto the common terminal of the resistance R1 and the transformer T; a resistance R4 and a capacitor C2 are connected between the phototriode in the optocoupler OP0 and the secondary coil of the transformer T in series; the resistance R4 and the capacitor C2 form an RC (Resistance-Capacitance) oscillator; the other terminal of the phototriode in the optocoupler OP0 is grounded via a capacitance C3; meanwhile, the other terminal of the phototriode in the optocoupler OP0 is connected onto the secondary coil of the transformer T via a diode D1; and the output of the secondary main coil is outputted to the touch sensing module and a relay and driving module to feed power via a rectifying diode D2 and a diode D4.

The energy-saving electronic touch switch has the beneficial effects that: the energy-saving electronic touch switch can drive various loads and has a wider range of possible loads including inductive, capacitive or purely resistive loads and high-frequency switch power source loads, such as energy-saving lights, AC (Alternating Current) motors, LEDs (Light Emitting Diodes) new light sources, common fluorescent lamps, and the like. The energy-saving electronic touch switch overcomes the disadvantages of small load range and weak load capacity of conventional switches. The energy-saving electronic touch switch is provided with a load detecting module used for detecting load voltages, and the like, and has achieved over-voltage and over-load protection. Meanwhile, the energy-saving electronic touch switch employs a switch power supply as a power supply module, which can lighten self power consumption by utilizing the high efficiency of the power supply module so as to drive loads of lower power such as an LED (Light Emitting Diode) lamp, etc. In addition, the energy-saving electronic touch switch employs chips with low power consumption such as LDO (Low Dropout Regulator) voltage regulator chips, touch chips, and the like, which can reduce the overall power consumption, wherein the overall power consumption is less than 2.2 mW (measured without a backlight indicator lamp) and the single static overall power consumption is less than 10 mW (measured under an indicator lamp). The energy-saving electronic touch switch simplifies circuits and improves the power supply utilization rate. The energy-saving electronic touch switch employs two LDOs (Low Dropout Regulators) of different voltage stabilizing values (U2=3.0V, U3=3.3V); a feeder power supply and a switch power supply separately feed power; when single LDO is switched on, the power consumption of the rest loads cannot be influenced; in this way, the energy-saving electronic touch switch really satisfies the demand of supplying power independently through self switching on and feeder. The energy-saving electronic touch switch employs different filter circuits separately for feeder low frequency filter and high frequency switch power supplies, thus eliminating the influences of resetting time while being energized; in this way, the circuits are more stable and safer. A load detecting circuit is also arranged in the energy-saving electronic touch switch to provide load detection for the switch; if the energy-saving electronic touch switch has no loads, a background indicator lamp of this circuit is not light and touch does not work; meanwhile, whether the load of this circuit is damaged (open circuit) can be judged. In case of no loads, a touch position can be judged accurately to make the energy-saving electronic touch switch more humanized. The energy-saving electronic touch switch simplifies circuits and improves the power source utilization rate. The energy-saving electronic touch switch employs different filter circuits separately for feeder low frequency filter and high frequency switch power supplies, thus eliminating the influences of resetting time while being energized; in this way, the circuits are more stable and safer.

The energy-saving electronic touch switch employs sealed explosion-proof relays as switch elements which can reach a load power of 1000 W and can satisfy the requirement of using on a switch occasion with larger power. The energy-saving electronic touch switch uses field-effect tubes to feed power and utilizes the voltage driving characteristic and internally arranged backward diodes of the field-effect tubes to switch on for a long period of term and switch off intermittently to obtain a pulsating direct current which is stabilized by a voltage stabilizing system then to feed power required, and can drive various loads.

When the energy-saving electronic touch switch is applied into two groups (that is, double control, which means that two switches control one load), lower power can be controlled to reach a 5 W load; when the energy-saving electronic touch switch is applied into single group (that is, single switch controls one load), the power can even reach 1 W; moreover, all the energy saving lamps (including LED lamps) can be controlled regardless of load types.

The energy-saving electronic touch switch can implement to control same load at two places; the energy-saving electronic touch switch employs a capacitive electronic touch switch, which can achieve the functions same to the mechanical switches; the energy-saving electronic touch switch is safer and has a longer service life; meanwhile, the problem of service life of the mechanical switch can be stopped. The energy-saving electronic touch switch has ultra-low power consumption; under a standby state, the combined power consumption of two groups of switches is approximately 20 mW, which is far lower than the standby power consumption specified by energy standards; moreover, the energy-saving electronic touch switch employs a single wire mechanism, which can replace the mechanical switch directly without needing to rewire, thus saving wires and labor cost. The energy-saving electronic touch switch is suitable for controlling the same load (such as lamp, motor, fan, etc) at two places; for example, while installing the energy-saving electronic touch switch on a corridor, the energy-saving electronic touch switch can be touched to turn on a stair lamp on the first floor and can be touched at the other end to turn off after arriving at the second floor. In view of home use, multiple energy-saving electronic touch switches can be installed at the entrance of the house; after corresponding lamps are turned on, the lamps can be turned off by using the energy-saving electronic touch switches of this type at each subcontrol point, thus stopping returning to the entrance of the house to turn off the lamp and then returning to the place that the lamp is lighting in the dark.

BRIEF DESCRIPTIONS OF THE DRAWINGS

Descriptions of the Drawings

PREFERRED EXAMPLE EMBODIMENTS OF CARRYING OUT THE PRESENT INVENTION

Detailed Descriptions of the Example Embodiments

The example embodiment is a preferred example embodiment of the present invention; and those example embodiments with same or similar principles and basic structures are all within the protection scope of the present invention.

Figure 1:
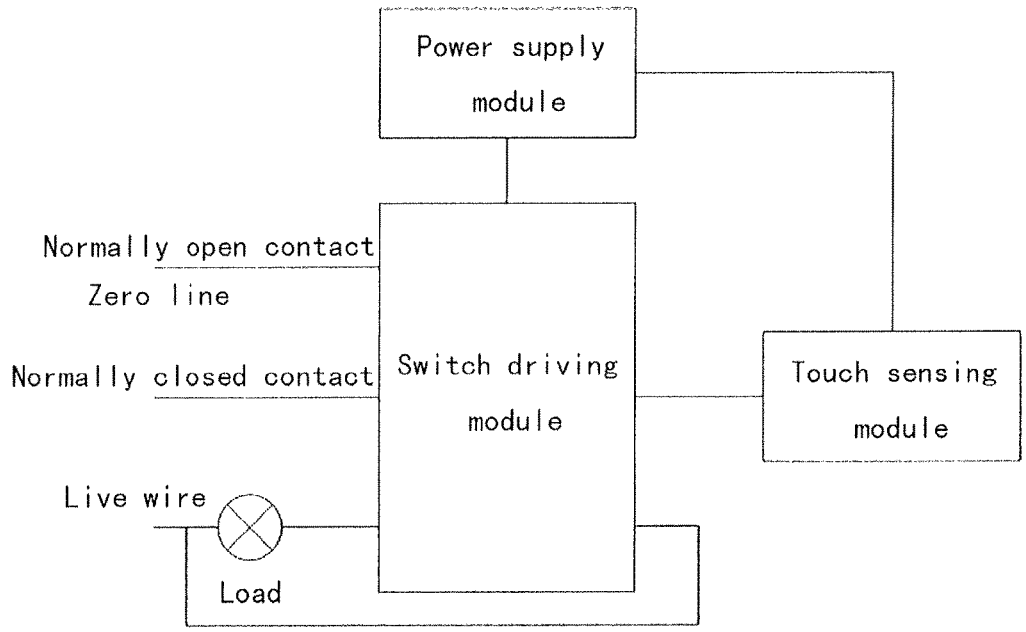
FIG. 1 is a block diagram of a basic circuit of the present invention.

As illustrated in FIG. 1, the basic structure of the present invention comprises a touch sensing module, a power supply module and a switch driving module, wherein the touch sensing module is used for receiving a touch sensing signal inputted by a capacitive touch switch, and controlling the action of the switch driving module according to the touch sensing signal, so as to switch on a power supply circuit for the load; and the power supply module feeds power to the touch sensing module. The energy-saving electronic touch switch can be optionally provided with load detecting modules, wherein the load detecting module switches detect the voltages outputted by the switch driving module and feed back to the touch sensing module; more than one load detecting module is arranged; and each load detecting module detects the voltage outputted by one switch driving module and feeds back to the touch sensing module. In order to make an external power supply provide power to the energy-saving electronic touch switch more stably, the energy-saving electronic touch switch is further provided with a feeder unit; in the example embodiment, the feeder unit comprises a voltage stabilizing diode and a rectifying unit; the voltage stabilizing diode is connected onto the control terminal of a bidirectional triode thyristor and outputs to the rectifying unit, and the rectifying unit after rectifying outputs to the power supply module. In order to make a user know the working state of the energy-saving electronic touch switch more clearly, the energy-saving electronic touch switch can further comprise a state indicating module used for indicating work of the power supply module, wherein the state indicating module is connected with the output terminal of the power supply module.

The structure of the present invention are described below by giving reference to several detailed example embodiments of the present invention.

Figure 2:
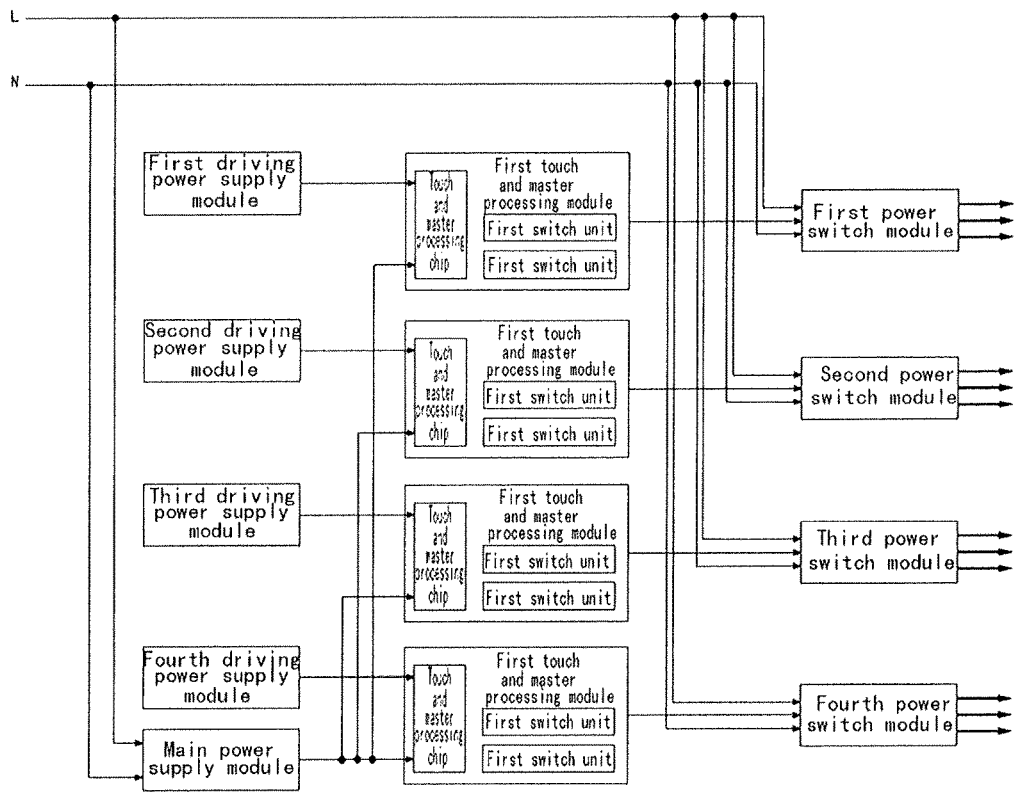
FIG. 2 is a block diagram of a circuit of a first example embodiment of the present invention.

First example embodiment (as illustrated in FIG. 2 to FIG. 6): as illustrated in FIG. 2, the example embodiment mainly comprises a capacitive touch switch, a touch sensing module, a driving power supply module, a power switch module and a main power supply module; both the driving power supply module and the main power supply module in the example embodiment belong to the power supply module; the capacitive touch switch is connected onto the touch sensing module; an on-off signal is inputted to the touch sensing module through the capacitive touch switch, the capacitive touch switch controls the power switch module to work, the power switch module supplies power to loads, the main power supply module provides electric energies to the power switch module, and the driving power supply module supplies power to other modules.

In the example embodiment, the structure of the example embodiment is described concretely by taking that four channels are arranged in the same switch for example, that is, taking that the same switch can simultaneously control the on and off of four lamps for example; during concrete implementation, one channel or two channels or multiple channels can also be arranged according to the actual needs, and the structure is the same with the basic structure of the example embodiment.

Figure 3:
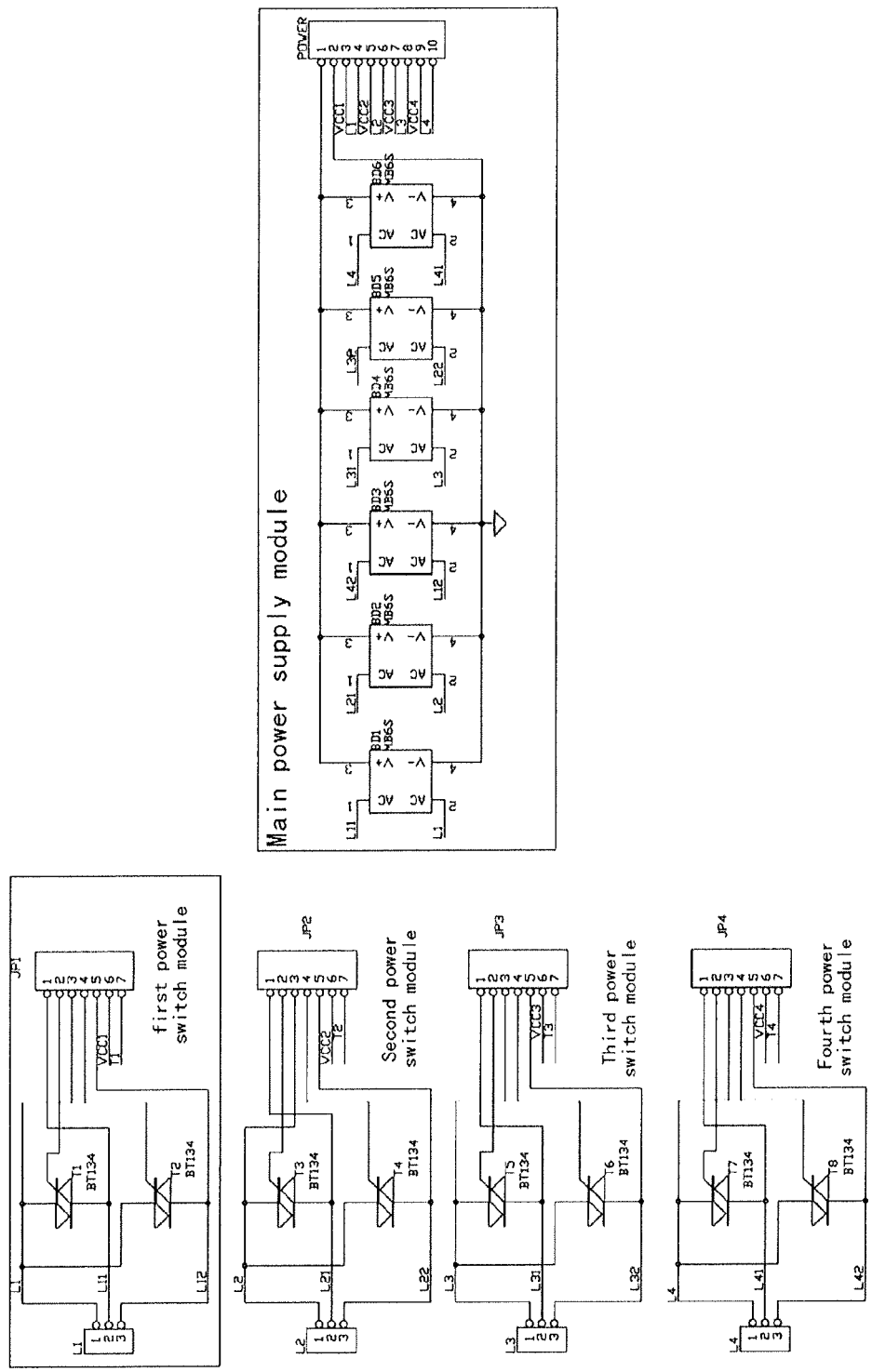
FIG. 3 is a schematic diagram of a circuit of a main board part of the first example embodiment of the present invention.
Figure 4:
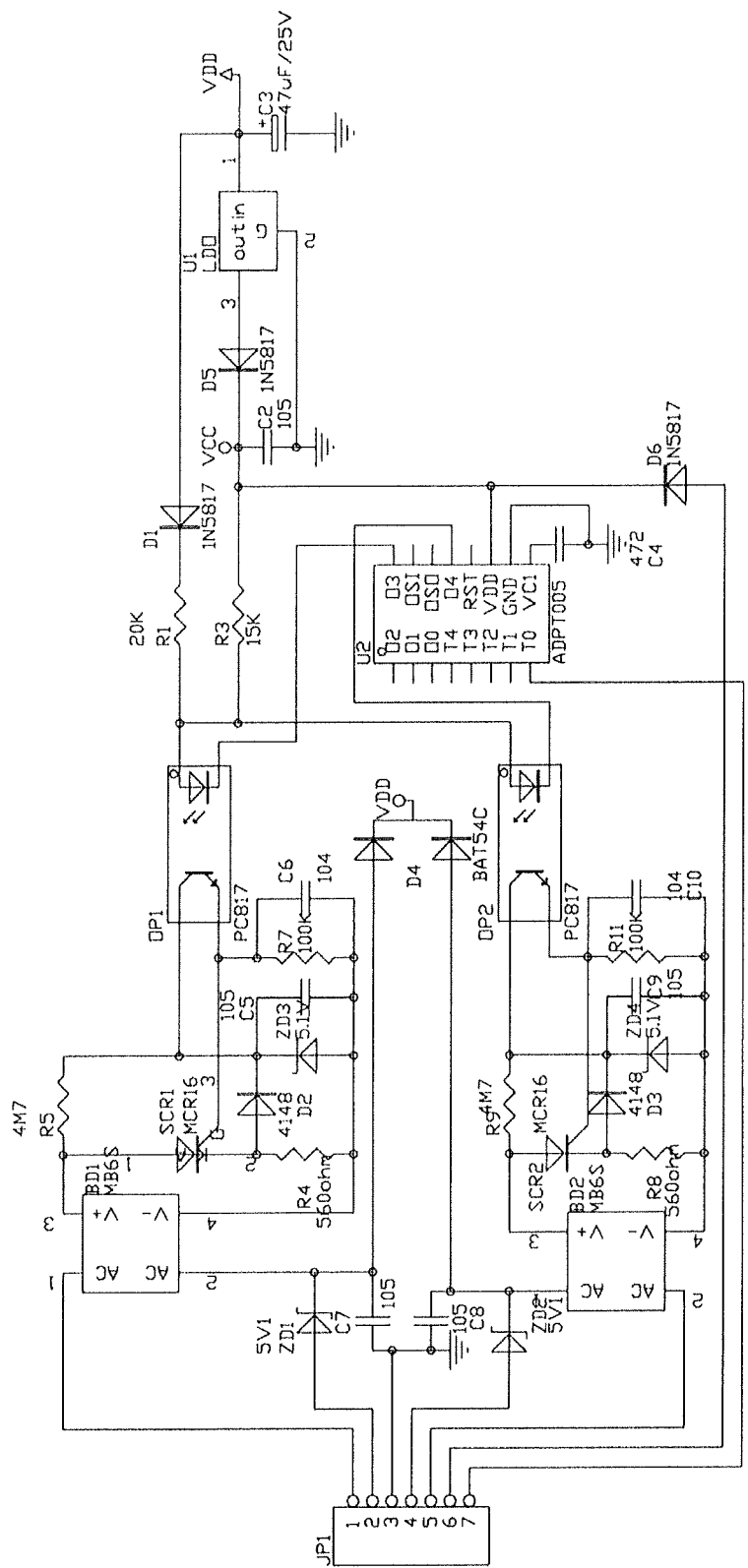
FIG. 4 is a schematic diagram of a circuit of a switch control part of the first example embodiment of the present invention.

As illustrated in FIG. 3, four power switch modules are arranged in the example embodiment, wherein each power switch module controls one channel; that is, each power switch module controls one lamp. In the example embodiment, the first power switch module is taken for example to concretely describe the structure of the power switch module, wherein the first power switch module comprises two bidirectional triode thyristors, one three point interface and a seven point interface JP1; the two bidirectional triode thyristors are respectively thyristor T1 and thyristor T2; one interface in the thyristor T1 and one interface in the thyristor T2 are simultaneously connected together, and are simultaneously connected onto one interface point (the first interface point in the example embodiment) of the three point interface; the other interface of the thyristor T1 is connected onto another interface point (the second interface point in the example embodiment) of the three point interface; the other interface of the thyristor T2 is connected onto the third interface point (the third interface point in the example embodiment) of the three point interface; and the three point interface is used for being connected with lamps and lanterns. The seven point interface JP1 is used for being connected with the touch sensing module. In the example embodiment, each power switch module is connected with the touch sensing module, wherein a first interface point in the seven point interface JP1 used for inputting an alternating current power supply is connected with the second interface point of the three point interface; a second interface point in the seven point interface JP1 used for inputting the alternating current power supply is connected with the control terminal of the thyristor T1; a third interface point in the seven point interface JP1 is connected with the first interface point of the three point interface; a fourth interface point in the seven point interface JP1 is connected with the control terminal of the thyristor T2; a fifth interface point in the seven point interface JP1 is connected with the third interface point of the three point interface; a sixth interface point in the seven point interface JP1 is connected with a low voltage direct current power supply; and a seventh interface point in the seven point interface JP1 is connected with a capacitive touch switch. Moreover, the concrete connection relationship of the three point interface and the seven point interface are not limited to the example embodiment above, and can be changed according to detailed demands as long as corresponding circuit connection relationship can be satisfied. As illustrated in FIG. 3, a core part of the touch sensing module in the example embodiment is a touch and master processing chip U2 with a capacitive touch switch recognition function; in the example embodiment, a chip with a model of ADPT005 is employed as the touch and master processing chip U2, wherein the chip is provided with capacitive touch switch recognition and data processing functions; in the example embodiment, the sensitivity control terminal of the touch and master processing chip U2 is connected with a capacitance C4, wherein the capacitance C4 is a touch sensitivity regulating capacitance; when the volume of the capacitance is changed, the sensitivity can be changed. In the example embodiment, the touch sensing module is further provided with switch units controlled by the touch and master processing chip U2; in the example embodiment, two groups of switch units are arranged, wherein the circuit structures of the two groups of switch units are same; in the example embodiment, the control terminals of the two groups of switch units are respectively connected with one I/O (Input/Output) port of the touch and master processing chip U2 to form an interlocking structure via connection; during concrete implementation, the control terminals of the two groups of switch units may also be connected onto the same I/O (Input/Output) port of the touch and master processing chip U2; an inverter is connected between the control terminals of the two groups of switch units to form hard interlocking; that is, when the first group of switch units are switched on, the second group of switch units are not switched on, and when the second group of switch units are switched on, the first group of switch units are not switched on. Taking the circuit of the first group of switch units in the example embodiment for example, the circuit structure thereof is concretely described, wherein the first group of switch units mainly comprise an optocoupler OP1, a thyristor SCR1 and a rectifying bridge BD1; one terminal of a light emitting diode in the optocoupler OP1 is connected onto the output terminal of the driving power supply module and the other terminal of the light emitting diode in the optocoupler OP1 is connected onto one I/O (Input/Output) port of the touch and master processing chip U2; a phototriode in the optocoupler OP1 controls switching on-off at the thyristor SCR1, and the thyristor SCR1 is connected onto the output terminal of the rectifying bridge BD1; in the example embodiment, the thyristor SCR1 is connected with a resistance R4 in series and is connected onto the output terminal of the rectifying bridge BD1; a resistance R5 is connected with a voltage stabilizing diode ZD3 in series and is connected onto the output terminal of the rectifying bridge BD1; the common terminal of the resistance R5 and the voltage stabilizing diode ZD3 is connected onto the output terminal of the phototriode in the optocoupler OP1; the output terminal of the phototriode in the optocoupler OP1 is connected onto the control terminal of the thyristor SCR1; a capacitance C5 is connected with the voltage stabilizing diode ZD3 in parallel; a resistance R7 is spanned between the negative electrode of the output terminal of the phototriode in the optocoupler OP1 and the negative electrode of the output terminal of the rectifying bridge BD1; a capacitance C6 is connected with the resistance R7 in parallel; thus, three circuits are formed; the thyristor SCR1 and the resistance R4 connected in series form a first major loop circuit; the resistance R5 and the voltage stabilizing diode ZD3 forms a second loop circuit; the phototriode in the optocoupler OP1 and the resistance R7 forms a third loop circuit; when the switch units are not switched on, the primary of the rectifying bridge BD1 cannot be switched on as the value of the resistance R5 is larger; therefore, a bidirectional triode thyristor T1 connected with the rectifying bridge BD1 cannot be switched on; when the switch units are switched on, the secondary of the rectifying bridge BD1 and the resistance R4 form a closed loop circuit via the thyristor SCR1 to make the primary current of the rectifying bridge BD1 larger; and the bidirectional triode thyristor T1 connected with the rectifying bridge BD1 is switched on, and the lamps and lanterns controlled by the bidirectional triode thyristor T1 lights; meanwhile, the existence of the voltage stabilizing diode ZD3 clamps the potential of the phototriode in the optocoupler OP1 at 5.1V so that the phototriode in the optocoupler OP1 cannot be burnt down; meanwhile, the resistance R7 and the capacitance C6 connected in parallel can play a role of resisting interference so as to prevent the thyristor SCR1 from being triggered. The driving power supply module supplies power to the touch sensing module; in the example embodiment, the driving power supply module comprises a voltage stabilizing diode ZD1 and a voltage regulator chip U1; the voltage stabilizing diode ZD1 is connected with the power supply loop circuit of the seven point interface in series; alternating current commercial power is clamped at 5.1V via the voltage stabilizing diode ZD1, outputted to the voltage regulator chip U1 via a diode D4, and then outputted to the touch sensing module to feed power after the voltage is stabilized by the voltage regulator chip U1. In the example embodiment, a capacitance C7 is connected between the third interface point in the seven point interface and the voltage stabilizing diode ZD1.

Figure 5:
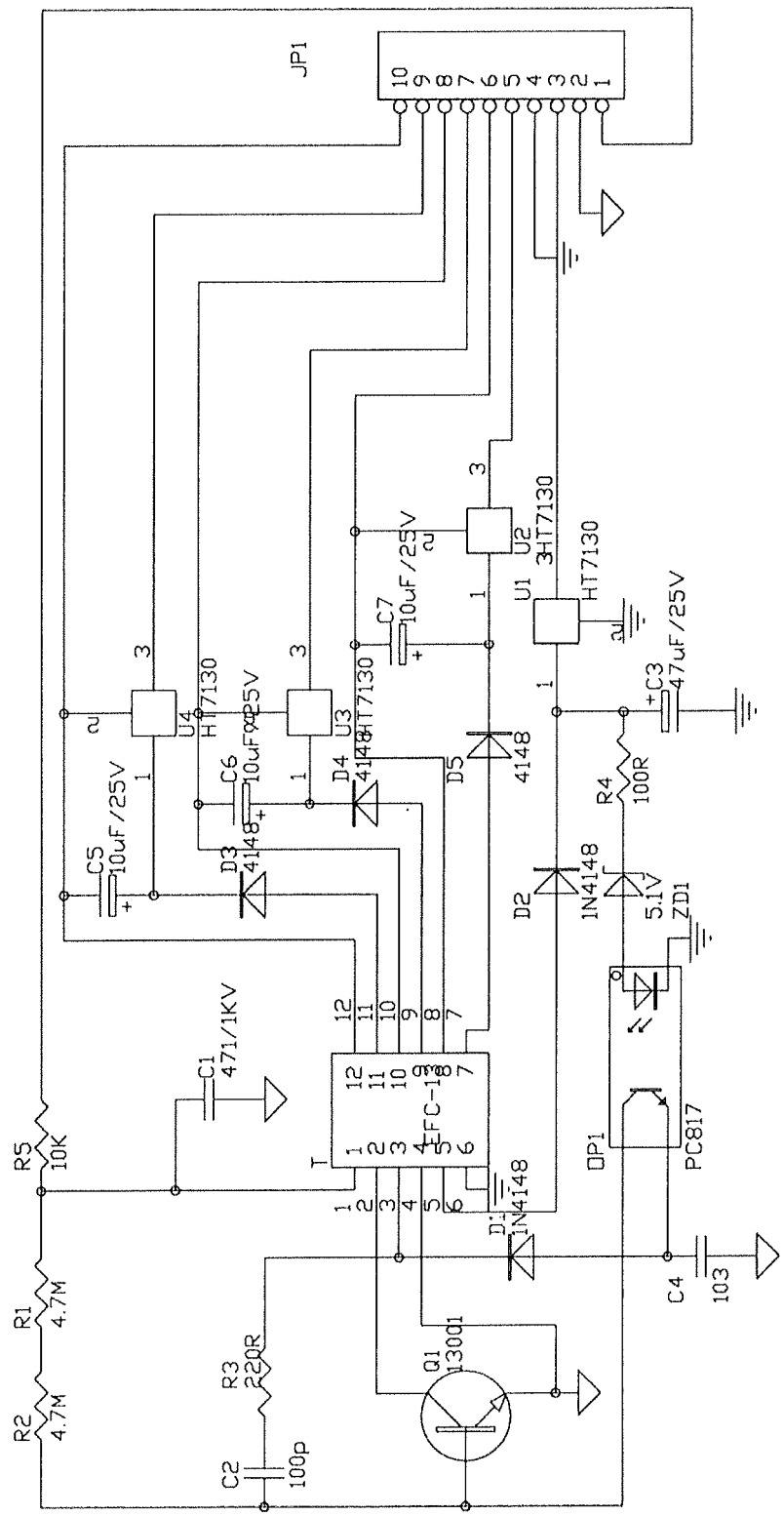
FIG. 5 is a schematic diagram of a circuit of a power supply part of the first example embodiment of the present invention.

As illustrated in FIG. 3 and FIG. 5, the main power supply module in the example embodiment comprises a rectifying bridge group and a transformer T; in the example embodiment, a transformer with a model of EFC-13 is employed as the transformer T, wherein the transformer comprises one circuit input and four circuit outputs; in the example embodiment, a multi-winding transformer is employed as the transformer T, which can implement electric isolation between multi-outputs so that the multi-outputs cannot influence mutually. As illustrated in FIG. 3, the rectifying bridge group in the example embodiment comprises six rectifying bridges (that is, BD1 to BD6), wherein the six rectifying bridges are connected in parallel to output; in the example embodiment, the six rectifying bridges are arranged for the connecting demand of loads; during concrete implementation, the quantity of the rectifying bridges can also be selected according to actual needs. In the example embodiment, the rectifying bridge group and the transformer T are connected via a ten point interface; the positive output of the rectifying bridge group is connected onto one input terminal of the primary of the transformer T via the resistance R5; meanwhile, the positive output of the rectifying bridge group after passing through a current limiting resistance R1, a resistance R2 and the resistance R5 which are connected in series is connected with the phototriode in the optocoupler OP1; the common point of the current limiting resistance R1, the resistance R2 and the resistance R5 which are connected in series, and the phototriode in the optocoupler OP1 is connected with the control terminal of a switching tube Q1; the switching tube Q1 is connected in series between another input terminal of the primary of the transformer T and the ground; meanwhile, a capacitance C1 is connected onto the common terminal of the resistance R5 and the transformer T; the resistance R5 and the capacitance C1 form an RC (Resistance-Capacitance) oscillator, thus forming a high frequency switch power supply; and the switch power supply is utilized to convert the high efficiency of the commercial power into 5V low voltage direct current power. The four circuit outputs of the transformer T are respectively connected with a voltage regulator chip; the transformer T is utilized to isolate the common grounding point so that the four circuit outputs form respective channels thereof that are not isolated mutually; the four voltage regulator chips respectively output via the ten point interface and feed power to the corresponding touch and master processing chips via one diode; while power-on, the main power supply module supplies power to the touch and master processing chips; when the circuits are switched on, the voltage stabilizing diode ZD1 supplies power to the touch and master processing chips, wherein one circuit output is connected with the voltage stabilizing diode ZD1 and a light emitting diode of the optocoupler OP1 that are connected in series; the voltage stabilizing diode ZD1 is utilized to sample output voltage; when the output voltage exceeds the voltage stabilizing value of the voltage stabilizing diode ZD1, the voltage stabilizing diode ZD1 is switched on and the voltage is fed back to the switching tube Q1 via the optocoupler OP1, thus implementing the purpose of stable output.

Figure 6:
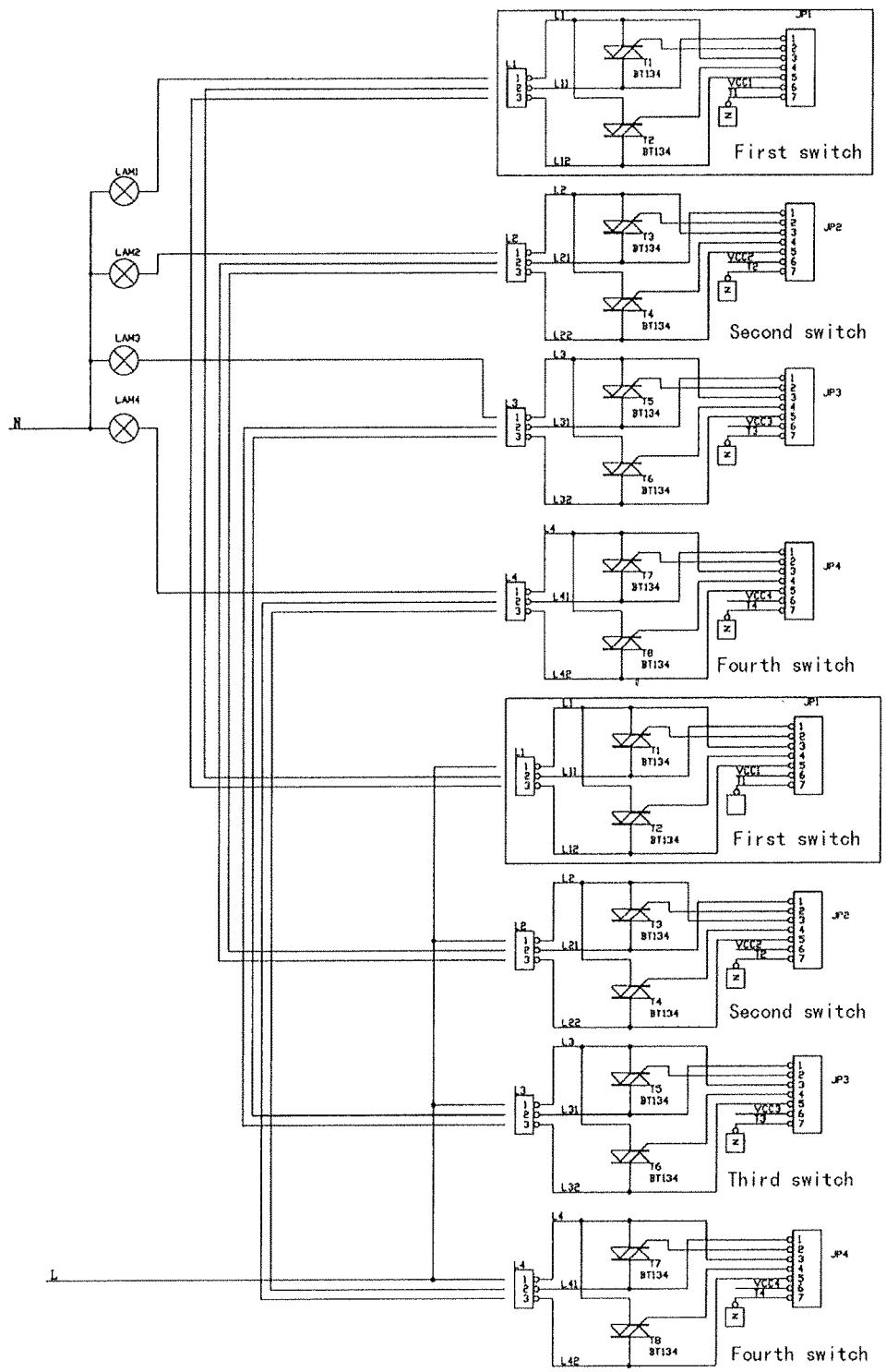
FIG. 6 is a schematic diagram of an application circuit of the first example embodiment of the present invention.

When in use, the wiring method of the example embodiment is the same with that of a mechanical type single-pole double-throw switch; in the example embodiment, two electronic switches can be employed to control four loads simultaneously at two places; during concrete implementation, one load or two loads or three loads can be controlled according to the actual need; as illustrated in FIG. 6, lamps are taken as the loads in the example embodiment to illustrate the specific example embodiment; during concrete implementation, loads of other forms can also be used, wherein the first points in four three point interfaces of a first switch are respectively connected with one terminals of the lamps; the other terminal of each lamp is connected with a zero line respectively; the second point in the first two point interface in the first switch is connected with the second point in the first three point interface in a second switch; the third point in the first three point interface in the first switch is connected with the third point in the first three point interface in the second switch; the second points in the rest three point interfaces in the first switch are respectively connected with one third point in the rest three point interfaces in the second switch; the third points in the rest three point interfaces in the first switch are respectively connected with one second point in the rest three point interfaces in the second switch; the first points in the four three point interfaces in the second switch are respectively connected with a live wire; the two switches are respectively arranged at two places; for example, one is arranged at a first floor and the other one is arranged at a second floor; or, one is arranged at an entrance and the other is arranged in a room, and the like, the corresponding lamp can be turned on by touching a capacitive touch switch on one switch and can be turned off by touching a corresponding capacitive touch switch on the other switch.

Figure 7:
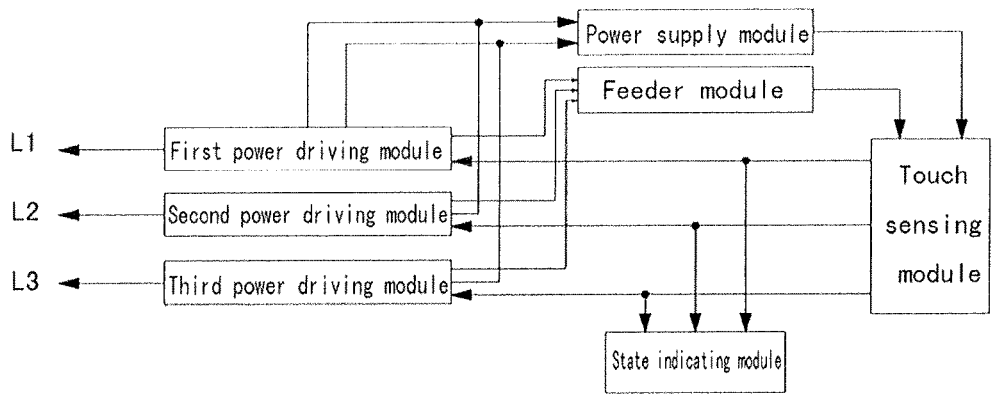
FIG. 7 is a block diagram of a circuit of a second example embodiment of the present invention.

Second example embodiment: as illustrated in FIG. 7, the example embodiment mainly comprises a touch sensing module, a power supply module and a switch driving module, wherein the touch sensing module is used for receiving a touch sensing signal inputted by a capacitive touch switch, and controlling the action of the switch driving module according to the touch sensing signal, so as to switch on a power supply circuit for the load; and the power supply module feeds power to the touch sensing module.

Figure 8:
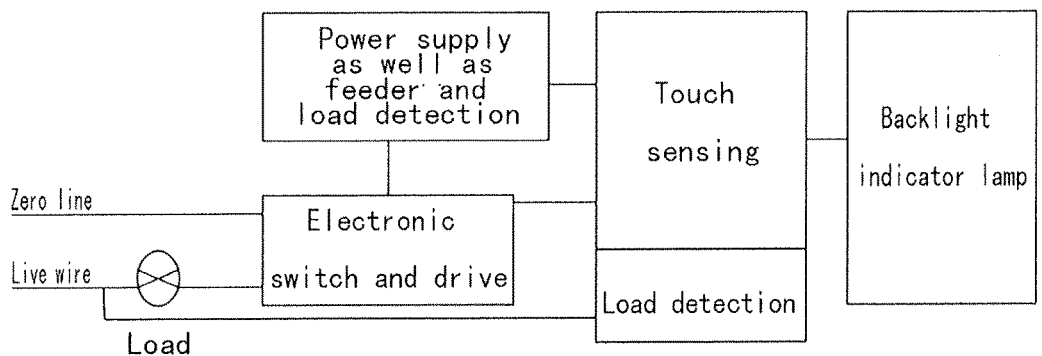
FIG. 8 is a block diagram of a circuit of a third example embodiment of the present invention.
Figure 12:
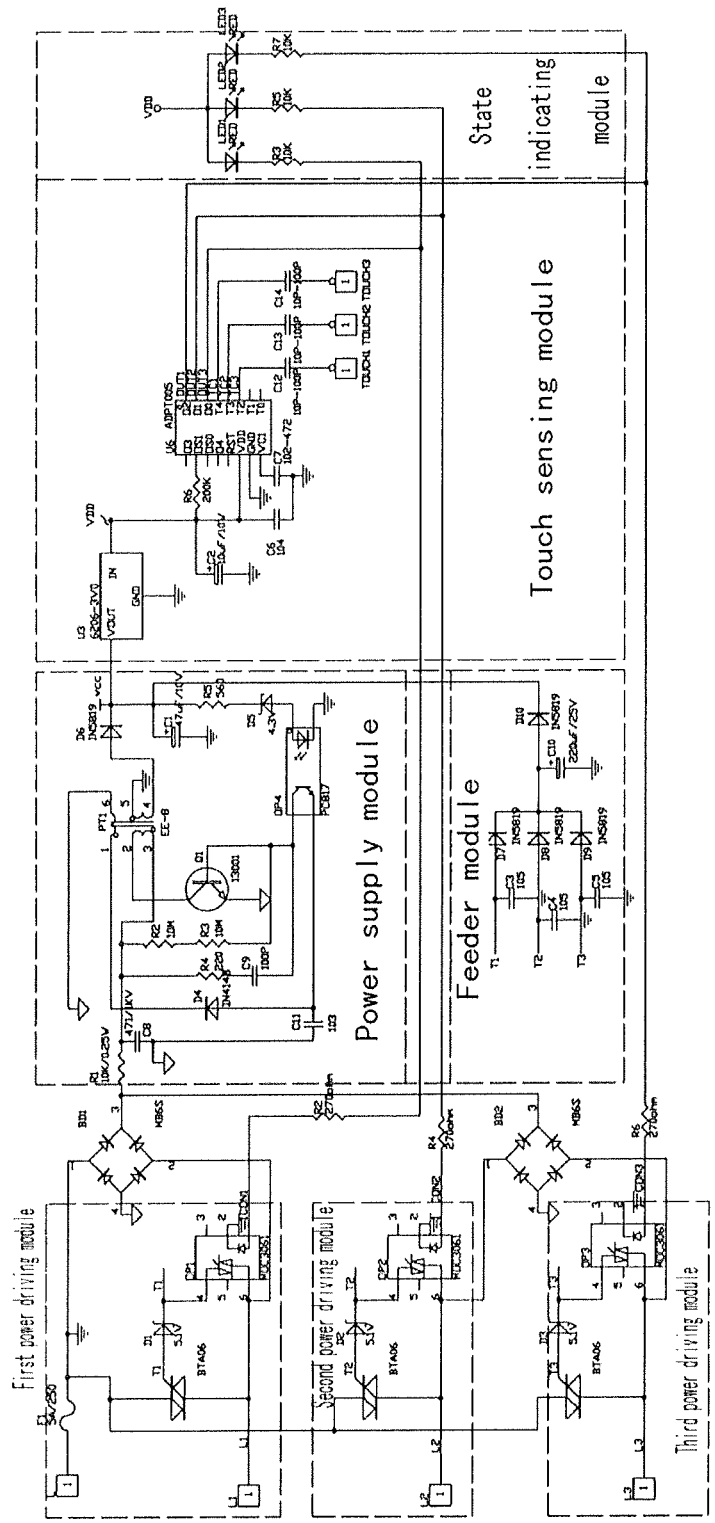
FIG. 12 is a schematic diagram of the circuit of the second example embodiment of the present invention.

As illustrated in FIG. 7 and FIG. 12, a core device of the touch sensing module in the example embodiment is a touch sensing chip U6; in the example embodiment, a touch sensing chip with a model of ADPT005 is employed as the touch sensing chip U6, which comprises five touch sensing inputs and five I/O (Input/Output) ports and has data processing capacity; the touch sensing chip U6 is a low power consumption touch device, the static power consumption of which is less than 5 uA; during concrete implementation, other chips with similar functions can also be employed for replacing. In the example embodiment, the touch sensing module is provided with more than one capacitive touch switch interface that can be used for connecting a capacitive touch switch; in the example embodiment, each capacitive touch switch interface is connected with one capacitance in series, which can play a role of filtering to reduce 50-100 Hz power supply noise jamming; during concrete implementation, the capacitive touch switch can be integrated in the example embodiment, and can also be arranged outside the example embodiment and is connected with the example embodiment via the interface. In the example embodiment, a regulating capacitance C7 is connected with a sensitivity regulating interface of a touch sensing chip U6, wherein the sensing sensitivity of the touch sensing chip U6 on the capacitive touch switch can be regulated by changing the volume of the capacitance C7. In the example embodiment, three circuits are taken as an example for implementing concrete description; that is, there capacitive touch switches are connected onto the touch sensing chip U6; meanwhile, the touch sensing chip U6 outputs three circuit control signals to control three switch driving modules to work; during concrete implementation, the control signals can be increased or reduced according to the actual need; one circuit control signal can be arranged; two circuit signals or other circuit signals can be arranged also; when only one circuit control signal is arranged, the example embodiment is an energy-saving single wire system single circuit capacitive touch switch; when more than two circuits are arranged, the example embodiment is an energy-saving single wire system multiple circuit capacitive touch switch. As illustrated in FIG. 7 and FIG. 8, the power supply module in the example embodiment comprises a rectifying bridge BD1, a transformer PT1, a switching tube Q1, an RC (Resistance-Capacitance) oscillator and a voltage regulator chip U3, wherein the rectifying bridge BD1 is connected onto a commercial power input interface of the example embodiment; in the example embodiment, one terminal of the rectifying bridge BD1 is connected onto a commercial power live wire input interface and the other terminal of the rectifying bridge BD1 is connected onto the load connecting terminal of a first circuit switch driving module; when the first switch driving module of the example embodiment is under an off state, a 220V direct current is directly added on the rectifying bridge BD1 and high voltage direct current power is outputted after the 220V direct current is rectified by the rectifying bridge BD1; in the example embodiment, the transformer PT1 and the switching tube Q1 form a high frequency switch power supply; the high voltage direct current power rectified by the rectifying bridge BD1 is directly inputted to one terminal of a primary coil of the transformer PT1 and the other terminal of the primary coil of the transformer PT1 is grounded via the switching tube Q1; in the example embodiment, a resistance R4 and a capacitance C9 form an RC (Resistance-Capacitance) oscillating unit; one terminal of the RC (Resistance-Capacitance) oscillating unit is connected onto the output of the rectifying bridge BD1 and the other terminal of the (Resistance-Capacitance) oscillating unit is connected onto the control terminal of the switching tube Q1 to control the on-off of the switching tube Q1, so that the high voltage direct current power after passing through the transformer PT1 is converted into a 5V low voltage power supply by the transformer PT1, and then is rectified by a diode D6 and inputted to a voltage regular chip U3, stabilized by the voltage regular chip U3, and outputted to the touch sensing chip U6 to feed power. In the example embodiment, an LDO (Low Dropout Regulator) device with low voltage difference and low power consumption is employed as the voltage regular chip U3 so as to reduce static power consumption in a voltage stabilizing circuit; in the example embodiment, a voltage stabilizing chip with a model of 6206-3V0 is employed as the voltage regular chip U3; during concrete implementation, other chips with similar functions can also be used for replacing. In the example embodiment, the power supply module further comprises a rectifying bridge BD2, wherein one terminal of the rectifying bridge BD2 is connected onto the load connecting terminal of a second switch driving module; the other terminal of the rectifying bridge BD2 is connected onto the load connecting terminal of a third switch driving module; the rectifying bridge BD2 and the rectifying bridge BD1 are connected in parallel; the output terminal of the rectifying bridge BD2 is also connected onto the transformer PT1; when one of the second switch driving module or the third switch driving module is switched on, externally connected commercial power is rectified via the rectifying bridge BD2 to feed power. In the example embodiment, a resistance R1 is connected in series between the rectifying bridge BD1, the rectifying bridge BD2 and the voltage regulator chip U3; a capacitance C8 is connected between the common terminal of the resistance R1 and the voltage regulator chip U3, and the ground; the resistance R1 and the capacitance C8 form an RC (Resistance-Capacitance) filter circuit, which can filter high frequency interference outputted by the rectifying bridge BD1 and the rectifying bridge BD2. In the example embodiment, the output of the voltage regulator chip U3 passes through a resistance R6 and is inputted to the oscillating signal input terminal of the touch sensing chip U6, wherein the resistance R6 is an oscillating resistance of the touch sensing chip U6. In the example embodiment, the power supply module further comprises a feedback unit, wherein the feedback unit mainly comprises an optocoupler OP4 and a voltage stabilizing diode D5; the voltage stabilizing diode D5 is connected onto the secondary coil of the transformer PT1, which is the input pin of the voltage regulator chip U3, and used for sampling the output voltage of the secondary coil of the transformer PT1, and outputting a sampling result to a light emitting diode in the optocoupler OP4; when the sampling result is higher than the breakdown voltage of the voltage stabilizing diode D5, the voltage stabilizing diode D5 is switched on to make the light emitting diode in the optocoupler OP4 light; meanwhile, the secondary of the optocoupler OP4 which is namely a phototriode in the optocoupler OP4 is also switched on; the phototriode in the optocoupler OP4 is outputted onto the control terminal of the switching tube Q1 and is switched on to reduce the potential at the control terminal of the switching tube Q1 to control the off of the switching tube Q1 and implement to output high voltage protection. As illustrated in FIG. 7 and FIG. 12, three switch driving modules are arranged in the example embodiment; the circuit structures of all the switch driving modules are the same; in the example embodiment, only the first switch driving module is taken as an example to concretely illustrate a circuit thereof. In the example embodiment, the first switch driving module mainly comprises an optocoupler OP1 and a bidirectional triode thyristor T1; the primary of the optocoupler OP1 is connected onto one I/O (Input/Output) port of the touch sensing chip U6; the secondary of the optocoupler OP1 is connected onto the control terminal of the bidirectional triode thyristor T1, and the loop circuit of loads is controlled to be on and off via the bidirectional triode thyristor T1. In the example embodiment, a state indicating module is also included; in the example embodiment, three LEDs (Light Emitting Diodes) are adopted as state indicator lamps, wherein each LED (Light Emitting Diode) is respectively connected onto one output terminal of the touch sensing chip U6 and used for indicating the working condition of one switch driving module; when the switch driving module on one output terminal of the touch sensing chip U6 is switched on, the corresponding I/O (Input/Output) port of the touch sensing chip U6 outputs low level, then the corresponding LED (Light Emitting Diode) is on; when the corresponding I/O (Input/Output) port of the touch sensing chip U6 outputs high level, the corresponding LED (Light Emitting Diode) is off, and the corresponding switch driving module is switched on to work. Meanwhile, the state indicator lamps can further be used as background lamps, which not only can indicate the working conditions of the corresponding switch driving modules, but also can indicate the location of the example embodiment in the dark. The example embodiment further comprises a feeder unit, wherein the feeder unit in the example embodiment comprises a voltage stabilizing diode D1, a voltage stabilizing diode D2, a voltage stabilizing diode D3 and a rectifying unit; the voltage stabilizing diode D1 is connected onto the control terminal of the bidirectional triode thyristor T1; the voltage stabilizing diode D1 is connected onto the control terminal of a bidirectional triode thyristor T2; the voltage stabilizing diode D3 is connected onto the control terminal of a voltage stabilizing diode T3; each voltage stabilizing diode respectively outputs to the rectifying unit; in the example embodiment, the rectifying unit comprises a diode D7, a diode D8, a diode D9 and a diode D10, wherein the diode D7 is connected with the output terminal of the voltage stabilizing diode D1; the diode D8 is connected with the output terminal of the voltage stabilizing diode D2; the diode D9 is connected with the output terminal of the voltage stabilizing diode D3; the outputs of the diode D7, the diode D8 and the diode D9 are respectively connected to a diode D10, and the diode D10 is outputted to the input pin of the voltage regulator chip U3; when the electronic switch in the example embodiment is switched on, and the power supply module part cannot work normally after a high voltage power supply is reduced, the feeder module can continuously provide a working current for the touch sensing chip U6.

In the example embodiment, the touch switch comprises four external interfaces, wherein one can be used for being connected with a fire wire of an alternating current commercial power and the other three interfaces are respectively connected with one load; the input interface connected with the live wire is respectively connected with one terminal of the secondary of the optocoupler in each switch driving module; and the other terminal of the secondary of the optocoupler in each switch driving module is respectively connected with one output interface connected with the load.

When the example embodiment is in use, the live wire is connected onto the input interface of the example embodiment that is connected with the live wire, and the other three interfaces are respectively connected with one load; when the load is not switched on, an external commercial power after being rectified by the rectifying bridge BD1 and transformed by the switch power supply part is outputted to the voltage regulator chip U3, and the voltage regulator chip U3 feeds power to the touch sensing chip U6. When a touch switch inputs a control signal to the touch sensing chip U6, the touch sensing chip U6 outputs the corresponding control signal to switch on the optocoupler in the corresponding switch driving module, then the optocoupler drives the bidirectional triode thyristor in the corresponding switch driving module to switch on; the bidirectional triode thyristor switches on the live wire and the corresponding load to power on the corresponding load; meanwhile, the corresponding state indicator lamp is off to implement on-off control.

Third example embodiment: as illustrated in FIG. 8, the example embodiment mainly comprises a touch sensing module, a power supply module, a switch driving module and a load detecting module, wherein the touch sensing module is used for receiving a touch sensing signal inputted by a capacitive touch switch, and controlling the action of the switch driving module according to the touch sensing signal, so as to switch on a power supply circuit for the load; the power supply module feeds power to the touch sensing module; and the load detecting module detects the voltage outputted by the switch driving module and feeds back to the touch sensing module.

Figure 13:
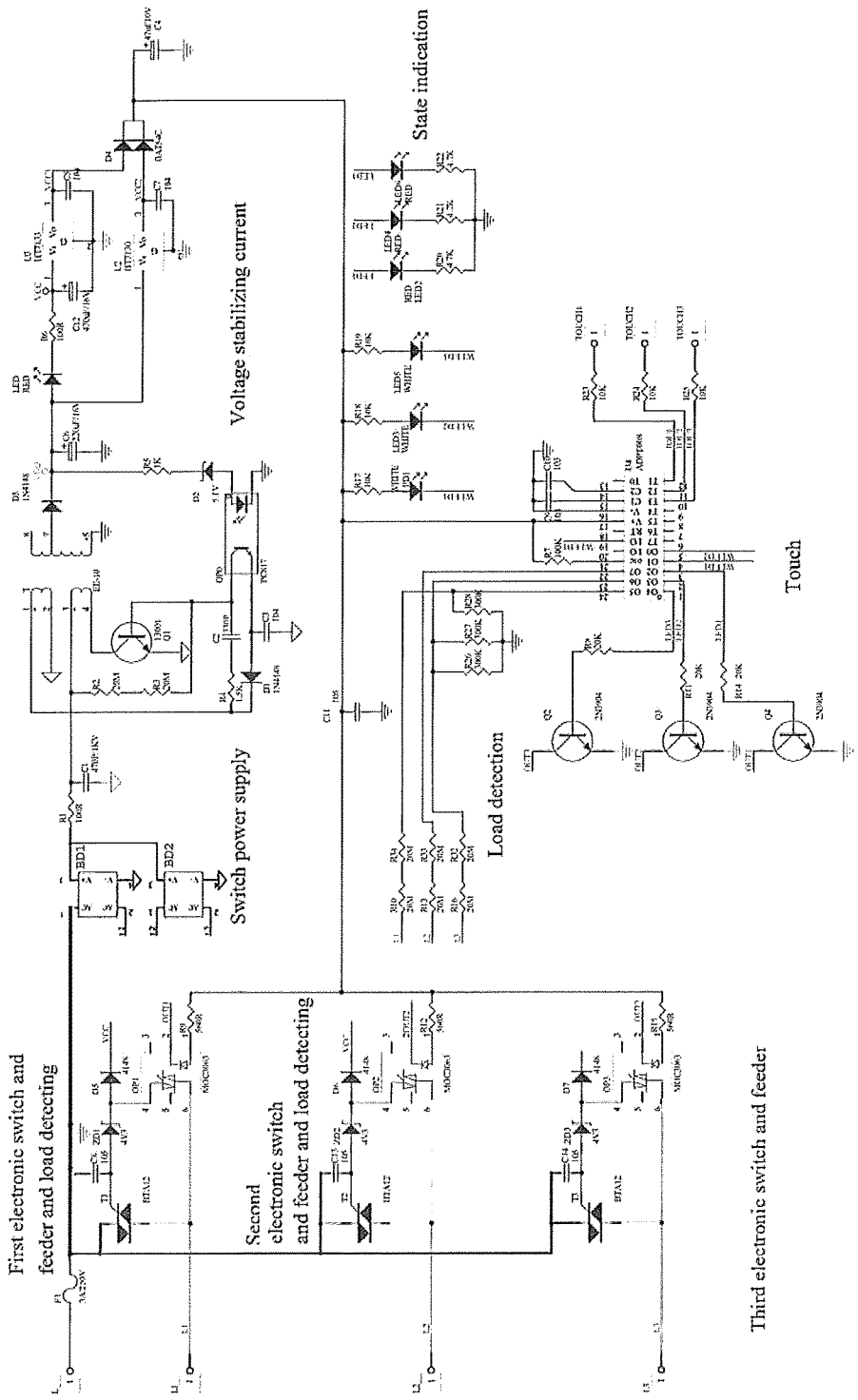
FIG. 13 is a schematic diagram of the circuit of the third example embodiment of the present invention.

As illustrated in FIG. 8 and FIG. 13, a core device of the touch sensing module in the example embodiment is a touch sensing chip U4; in the example embodiment, a touch sensing chip with a model of ADPT008 is employed as the touch sensing chip U4, which comprises eight circuit touch sensing inputs and eight I/O (Input/Output) ports and has data processing capacity; the touch sensing chip U4 is a low power consumption touch device, the static power consumption of which is less than 5 uA; during concrete implementation, other chips with similar functions can also be employed for replacing. In the example embodiment, the connecting way of the touch sensing module is basically the same with that in the second example embodiment and will not be repeatedly described here. In the example embodiment, the output terminal of the touch sensing chip U4 is respectively connected with an audion, wherein the touch sensing chip U4 respectively outputs signals to the bases of an audion Q2, an audion Q3 and an audion Q4; the emitters of the audion Q2, the audion Q3 and the audion Q4 are respectively grounded; the collectors of the audion Q2, the audion Q3 and the audion Q4 are respectively connected with the control input terminal of one switch driving module; and the touch sensing chip U4 controls the switch driving module to work via the audions.

As illustrated in FIG. 8, the power supply module in the example embodiment mainly comprises a switch power supply part and a voltage stabilizing module part, wherein the structure of the switch power supply part in the example embodiment is basically the same with that in the second example embodiment; an external power supply is converted into a 5V low voltage power supply via the switch power supply part, rectified by the diode D3 and inputted to a voltage regulator chip U2 and the voltage regulator chip U3, stabilized by the voltage regulator chip U2 and the voltage regulator chip U3, and then outputted to the touch sensing chip U4 to feed power. In the example embodiment, LDO (Low Dropout Regulator) devices with low voltage difference and low power consumption are employed as the voltage regular chip U2 and the voltage regular chip U3 so as to reduce static power consumption in a voltage stabilizing circuit; in the example embodiment, a voltage stabilizing chip with a model of HI7130 is employed as the voltage regular chip U2 and a voltage stabilizing chip with a model of HI7133 is employed as the voltage regular chip U3; during concrete implementation, other chips with similar functions can also be used for replacing. In the example embodiment, the outputs of the voltage regulator chip U2 and the voltage regulator chip U3 pass through a resistance R7 and are inputted to the oscillating signal input terminal of the touch sensing chip U4, wherein the resistance R7 is an oscillating resistance of the touch sensing chip U4. In the example embodiment, the power supply module further comprises a feedback unit, wherein the implementation way of a feedback module in the example embodiment is basically the same with that in the second example embodiment and will not be repeatedly described here.

As illustrated in FIG. 8 and FIG. 13, three switch driving modules are arranged in the example embodiment; the circuit structures of all the switch driving modules are the same; the implementation way of the switch driving module in the example embodiment is basically the same with that in the second example embodiment and will not be repeatedly described here. The optocoupler OP1 is a zero-crossing trigger opto-isolating driver, which can be used to make the load switched on only during current zero-crossing, thus reducing the interfering noise of the electronic switch, prolonging the service life of the load, and reducing the current impact damage on the electronic switch.

As illustrated in FIG. 8 and FIG. 13, the example embodiment further comprises a state indicating module; in the example embodiment, double color LEDs (Light Emitting Diodes) are employed as state indicator lamps, which include three red LEDs (Light Emitting Diodes) and three white LEDs (Light Emitting Diodes), wherein the three white LEDs (Light Emitting Diodes) are respectively connected onto one output terminal of the touch sensing chip U4 via one current limiting resistance and used for indicating the working condition of one switch driving module; when the switch driving module on one output terminal of the touch sensing chip U4 is switched on, the corresponding I/O (Input/Output) port of the touch sensing chip U4 outputs low level, then the corresponding LED (Light Emitting Diode) is on; when the corresponding I/O (Input/Output) port of the touch sensing chip U4 outputs high level, the corresponding LED (Light Emitting Diode) is off, and the corresponding switch driving module is switched on to work. The three red LEDs (Light Emitting Diodes) are respectively connected onto the control signal output terminal of the touch sensing chip U4. Meanwhile, the state indicator lamps can further be used as background lamps, which not only can indicate the working conditions of the corresponding switch driving modules, but also can indicate the location of the example embodiment in the dark. Double color LEDs (Light Emitting Diodes) are employed in the example embodiment; when the corresponding loads are powered on, the LEDs (Light Emitting Diodes) of one color are displayed; when the corresponding loads are powered off, the LEDs (Light Emitting Diodes) of another color are displayed.

The example embodiment further comprises a feeder unit, wherein the feeder unit in the example embodiment comprises a voltage stabilizing diode ZD1, a voltage stabilizing diode ZD2, a voltage stabilizing diode ZD3 and a rectifying unit; the voltage stabilizing diode ZD1 is connected onto the control terminal of a bidirectional triode thyristor T1; the voltage stabilizing diode ZD1 is connected onto the control terminal of a bidirectional triode thyristor T2; the voltage stabilizing diode ZD3 is connected onto the control terminal of a voltage stabilizing diode T3; each voltage stabilizing diode respectively outputs to the rectifying unit; in the example embodiment, the rectifying unit comprises a diode D5, a diode D6 and a diode D7, wherein the diode D5 is connected with the output terminal of the voltage stabilizing diode ZD1; the diode D6 is connected with the output terminal of the voltage stabilizing diode ZD2; the diode D7 is connected with the output terminal of the voltage stabilizing diode ZD3; the outputs of the diode D5, the diode D6 and the diode D7 are respectively connected to the input pin of the voltage regulator chip U3; when the electronic switch in the example embodiment is switched on, and the power supply module part cannot work normally after a high voltage power supply is reduced, the feeder module can continuously provide a working current for the touch sensing chip U4.

As illustrated in FIG. 8 and FIG. 13, the example embodiment further comprises a load detecting module, wherein the load detecting module employs divider resistances that are connected in series; in the example embodiment, three load detecting module is divided into three circuits to respectively detect the output of one switch driving module; in the example embodiment, the first circuit is taken as an example to implement concrete description; the first divider resistances comprise a resistance R10, a resistance R34 and a resistance R28 that are successively connected in series, wherein the resistance R10 is connected with the output terminal of the switch driving module; the resistance R28 is grounded; and the common terminal of the resistance R34 and the resistance R28 is connected with one I/O (Input/Output) port of the touch sensing module to transfer a detecting signal to the touch sensing module. The load detecting module can also provide load detection for the switch; if the switch has no loads, it can be seen on a panel that a background indicator lamp of this circuit is not light and touch does not work; meanwhile, whether the load of this circuit is damaged (open circuit) can be judged. In case of no loads, a touch position can be judged accurately to make the switch more humanized.

In the example embodiment, the touch switch comprises four external interfaces, wherein one can be used for being connected with a fire wire of an alternating current commercial power and the other three interfaces are respectively connected with one load; the input interface connected with the live wire is respectively connected with one terminal of the secondary of the optocoupler in each switch driving module; and the other terminal of the secondary of the optocoupler in each switch driving module is respectively connected with one output interface connected with the load.

When the example embodiment is in use, the live wire is connected onto the input interface of the example embodiment that is connected with the live wire, and the other three interfaces are respectively connected with one load; when the load is not switched on, an external commercial power after being rectified by the rectifying bridge BD1 and transformed by the switch power supply part is outputted to the voltage regulator chip U2 and the voltage regulator chip U3, and the voltage regulator chip U2 and the voltage regulator chip U3 feed power to the touch sensing chip U4. When a touch switch inputs a control signal to the touch sensing chip U4, the touch sensing chip U4 outputs the corresponding control signal to switch on the optocoupler in the corresponding switch driving module, then the optocoupler drives the bidirectional triode thyristor in the corresponding switch driving module to switch on; the bidirectional triode thyristor switches on the live wire and the corresponding load to power on the corresponding load; meanwhile, the corresponding state indicator lamp is off to implement on-off control.

Figure 9:
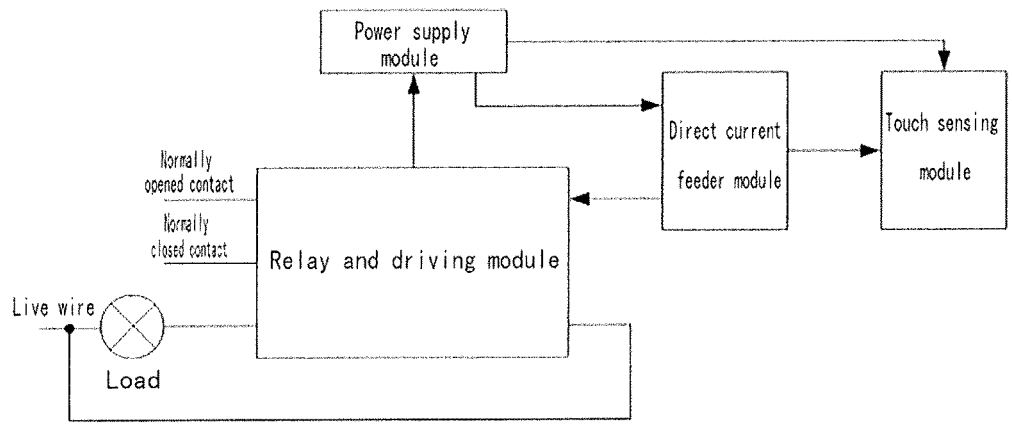
FIG. 9 is a block diagram of a circuit of a fourth example embodiment of the present invention.
Figure 14:
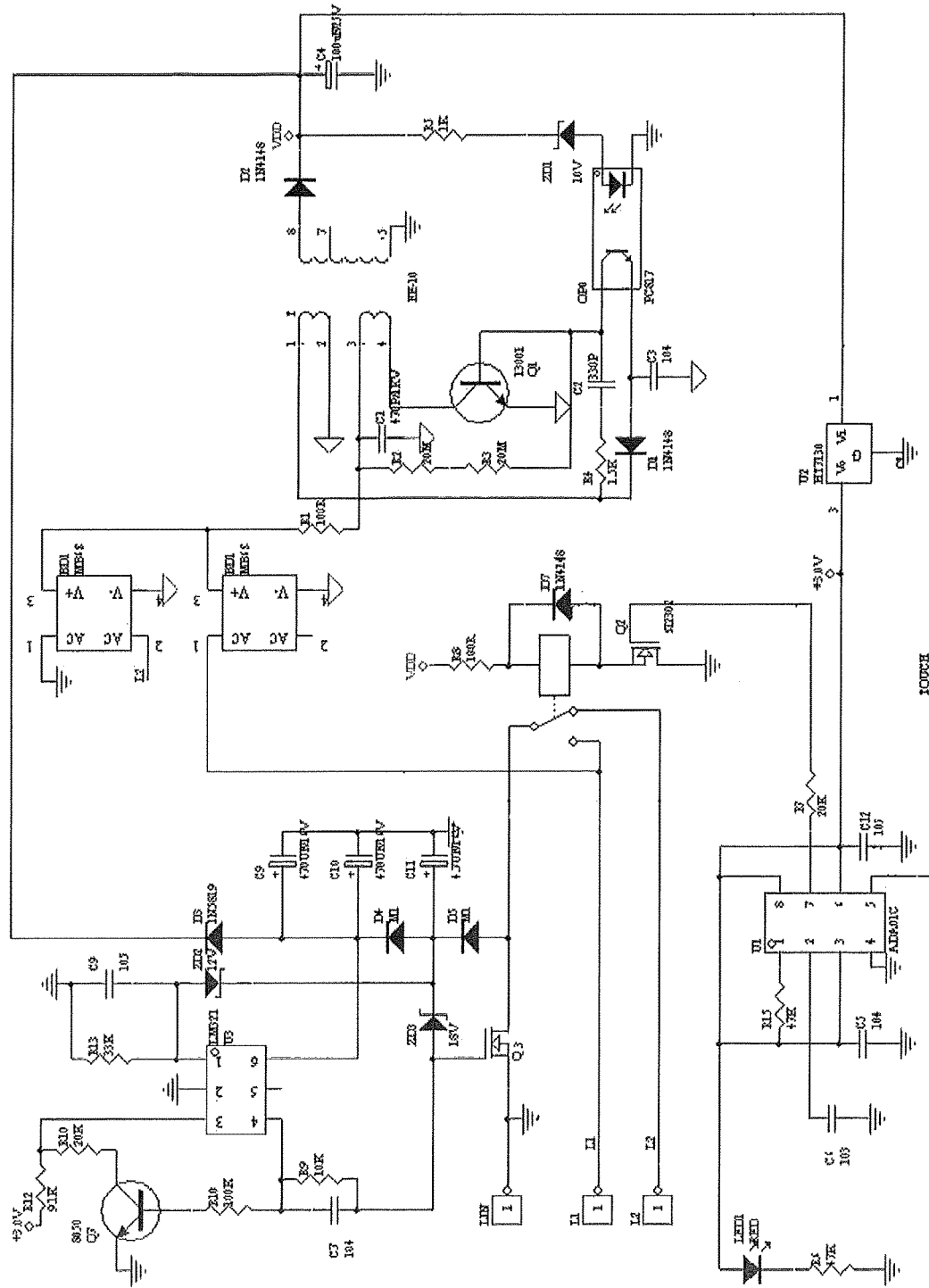
FIG. 14 is a schematic diagram of the circuit of the fourth example embodiment of the present invention.

Fourth example embodiment: as illustrated in FIG. 9 and FIG. 14, the example embodiment mainly comprises a relay switch and driving module, a touch sensing module, a direct current feeder module and a power supply module, wherein the direct current feeder module and the power supply module get power from the relay switch and driving module and feed power to the touch sensing module; and the relay switch and driving module controls external loads to work.

In the example embodiment, the implementation way of the power supply module is basically the same with that in the second example embodiment and will not be repeatedly described here. In the example embodiment, a core part of the touch sensing module is a touch and master processing chip U1 and a voltage regulator chip U2; in the example embodiment, a chip with a model of ADA01C with capacitive touch switch recognition and data processing functions is employed as the touch and master processing chip U1; in the example embodiment, the sensitivity control terminal of the touch and master processing chip U1 is connected with a capacitance C6, wherein the capacitance C6 is a touch sensitivity regulating capacitance; when the volume of the capacitance is changed, the sensitivity can be changed. The lower the capacitance value of the capacitance C6, the lower the sensitivity is; on the contrary, the sensitivity is higher. In the example embodiment, a resistance R16 is connected in series between a touch point and the touch and master processing chip U1; and the resistance R16 is connected in a touch access in series to improve anti-interference capacity; meanwhile, the sensitivity can be reduced. A voltage regulator chip with a model of HI7130 is employed as the voltage regulator chip U2 to stabilize the power supply outputted by the power supply module at 3.0V so as to feed the touch and master processing chip U1.

In the example embodiment, the direct current feeder module mainly comprises an operational amplifier U3, a switching tube Q3 and an audion Q4, wherein the 3.0V power supply outputted by the voltage regulator chip U2 is connected onto the inverting input terminal of the operational amplifier U3; the non-inverting input terminal of the operational amplifier U3 is grounded via a resistance R13; the output terminal of the operational amplifier U3 is connected onto the control terminal of the switching tube Q3; the switching tube Q3 is connected with a live wire of commercial power in series; and the external side terminal of the switching tube Q3 which is the terminal of the switching tube Q3 near a commercial power interface is grounded. The output terminal of the operational amplifier U3 is connected with a base of the audion Q4 via a resistance R10; and the audion Q4 is connected onto the inverting input terminal of the operational amplifier U3 via a resistance R17. In the example embodiment, the common terminal on a relay K1 is connected onto the input terminal of the voltage regulator chip U2 via a diode D5, a diode D4 and a diode D3 that are successively connected in series, wherein the diode D5 and the diode D4 are rectifying diodes; the diode D3 prevents the current at the input terminal of the voltage regulator chip U2 from inversing; in the example embodiment, a feeder filter capacitor C10 and a feeder filter capacitor C11 are respectively connected between the two terminals of the diode D4 and the ground. A voltage stabilizing diode ZD3 is connected between the common terminal of the diode D5 and the diode D4, and the control terminal of the switching tube Q3; and a voltage stabilizing diode ZD2 is connected between the common terminal of the diode D5 and the diode D4, and the non-inverting input terminal of the operational amplifier U3. When the example embodiment is in use, a high voltage power supply on a relay loop circuit disappears when the relay K1 is switched on, then the example embodiment loses the original power supply source; at the moment, the operational amplifier U3 outputs low level to control the switching tube Q3 to switch off; the diode D5 can obtain a high voltage power supply instantly to feed power to the capacitance C10 and the capacitance C11; the high voltage power supply after being rectified by the diode D5 and the diode D4 is clamped at 12V by the voltage stabilizing diode ZD2, and is outputted to the input terminal of the voltage regulator chip U2 via the audion D3 to form a feeder power supply loop circuit; and the direct current feeder module feeds power to the example embodiment temporarily so as to maintain the normal work of the example embodiment.

In the example embodiment, the relay switch and driving module comprises the relay K1 and a switching tube Q2, wherein the I/O (Input/Output) port of the touch and master processing chip U1 controls the on-off of the switching tube Q2, and the switching tube Q2 controls the work of the relay K1.

The example embodiment can be both served as a single set of switch and double sets of switch when in use; when the example embodiment is served as single set of switch, a load is connected onto a live wire of commercial power in series and connected onto the common terminal of the relay of the example embodiment, and a zero line of the commercial power is connected onto the normally open contact of a corresponding relay; when the example embodiment is served as double sets of switch, the load is connected onto the live wire of the commercial power in series and connected onto the common terminal of a first relay; the normally closed contact of the first relay is connected onto the normally open contact of a second relay; the normally open contact of the first relay is connected onto the normally closed contact of the second relay; and the zero line of the commercial power is connected onto the common terminal of the second relay.

Figure 10:
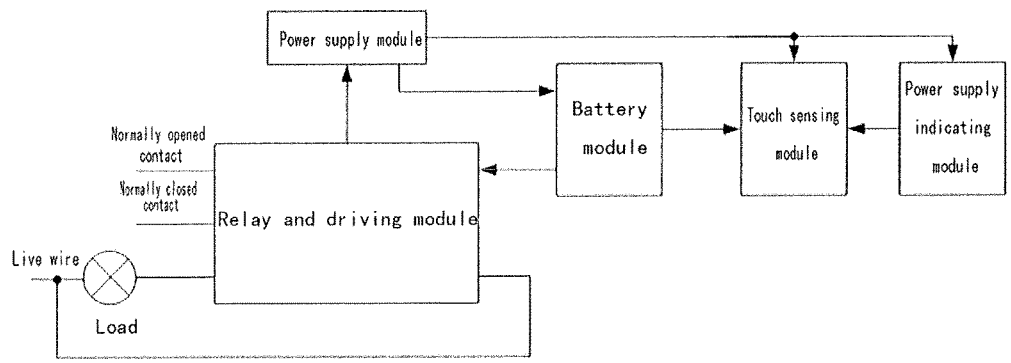
FIG. 10 is a block diagram of a circuit of a fifth example embodiment of the present invention.
Figure 15:
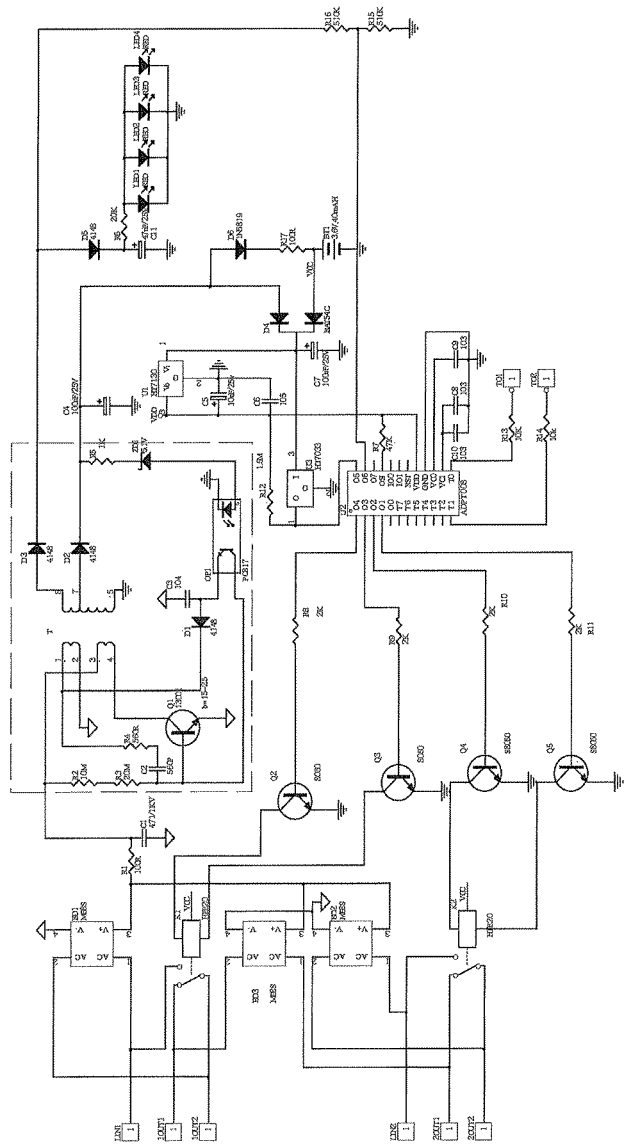
FIG. 15 is a schematic diagram of the circuit of the fifth example embodiment of the present invention.

Fifth example embodiment: as illustrated in FIG. 10 and FIG. 15, the example embodiment mainly comprises a relay and driving module, a touch sensing module and a power supply module, wherein the touch sensing module receives a touch sensing signal and controls the relay and driving module to work; the relay and driving module controls power feed of the load; and the power supply module feeds power to the relay and driving module and the touch sensing module. The example embodiment further comprises a battery module, wherein the power supply module can charge the battery module and the battery module can feed power to the relay and driving module and the touch sensing module. The example embodiment further comprises a state indicating module which is connected with the output terminal of the power supply module and used for indicating work of the power supply module.

In the example embodiment, the relay and driving module comprises two relays and four driving switch elements, wherein two circuits of loads can be controlled simultaneously in the example embodiment; during concrete implementation, one circuit output or multi-circuit outputs can also be set according to the actual need. In the example embodiment, the two relays are respectively relay K1 and relay K2, wherein the two relays respectively control one circuit of load; moreover, magnetic latching relays are employed as the relay K1 and the relay K2. In the example embodiment, the four driving switch elements are respectively audion Q2, audion Q3, audion Q4 and audion Q5, wherein the touch sensing module respectively outputs control signals to the audion Q2, the audion Q3, the audion Q4 and the audion Q5 to control the on-off of the audion Q2, the audion Q3, the audion Q4 and the audion Q5; the audion Q2 and the audion Q3 are respectively connected onto the control terminal of the relay K1 and used for controlling the suction and release of the relay K1; the audion Q4 and the audion Q5 are respectively connected onto the control terminal of the relay K2 and used for controlling the suction and release of the relay K2. During concrete implementation, the audions can also be replaced by switching tubes.

In the example embodiment, the implementation way of the power supply module is basically the same with that in the second example embodiment and will not be repeatedly described here. In the example embodiment, another circuit output of the secondary main coil of the transformer T is connected onto the power supply indicating module; in the example embodiment, the power supply indicating module refers to four LED (Light Emitting Diode) indicator lamps connected in series; meanwhile, the input terminal of the power supply indicating module is connected onto one output interface of the touch sensing module, and the working condition of the power supply of the example embodiment can be indicated via the power supply indicating module.

In the example embodiment, the implementation way of the touch sensing module is basically the same with that in the third example embodiment and will not be repeatedly described here. A voltage regulator chip with a model of HI7130 is employed as a voltage regulator chip U1 to stabilize the power supply outputted by the power supply module at 3.0V so as to feed a touch and master processing chip U2. The example embodiment is further provided with a battery detecting chip U3, wherein the input terminal of the battery detecting chip U3 is connected onto the positive electrode of a battery BT1 and used for detecting the voltage of the battery BT1; the output terminal of the battery detecting chip U3 is connected onto an I/O (Input/Output) port of the touch and master processing chip U2; when the voltage of the battery BT1 is lower than 3.3V, the battery detecting chip U3 outputs a pulse signal to the touch and master processing chip U2, then the touch and master processing chip U2 executes a tripping command to reset the magnetic latching relay and resume the work of the switch power supply, and provide a charging current to the battery BT1 to resume the electric quantity of the battery BT1. In the example embodiment, the four I/O (Input/Output) ports of the touch and master processing chip U2 respectively output to the audion Q2, the audion Q3, the audion Q4 and the audion Q5 to control the on-off of the audion Q2, the audion Q3, the audion Q4 and the audion Q5.

When the example embodiment is in use, the implementation way of the example embodiment is basically the same with that in the fourth example embodiment and will not be repeatedly described here.

Figure 11:
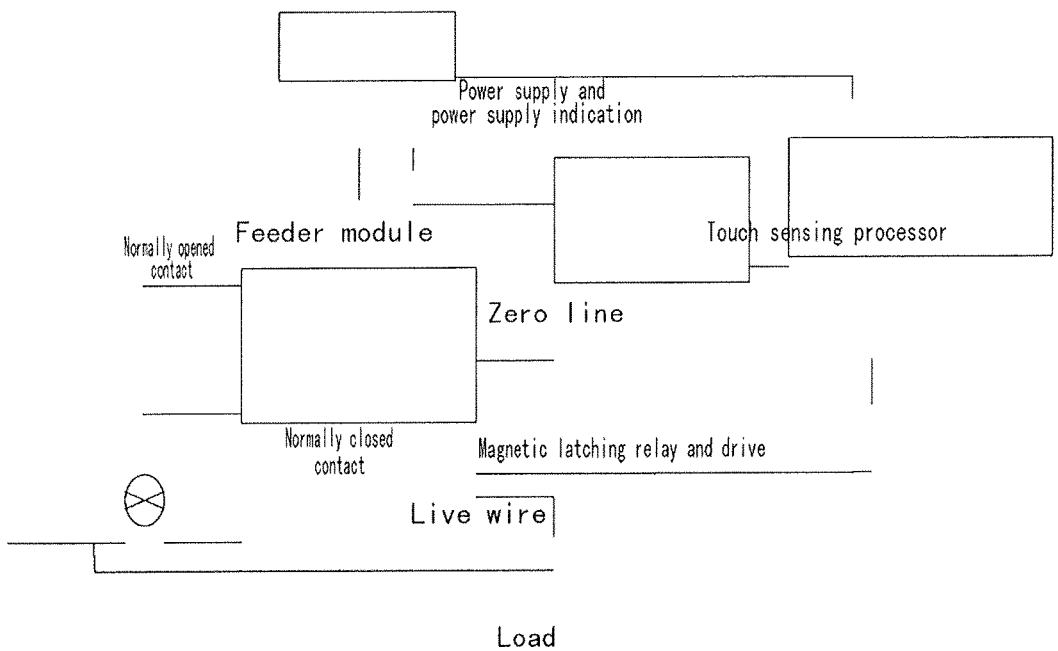
FIG. 11 is a block diagram of a circuit of a sixth example embodiment of the present invention.
Figure 16:
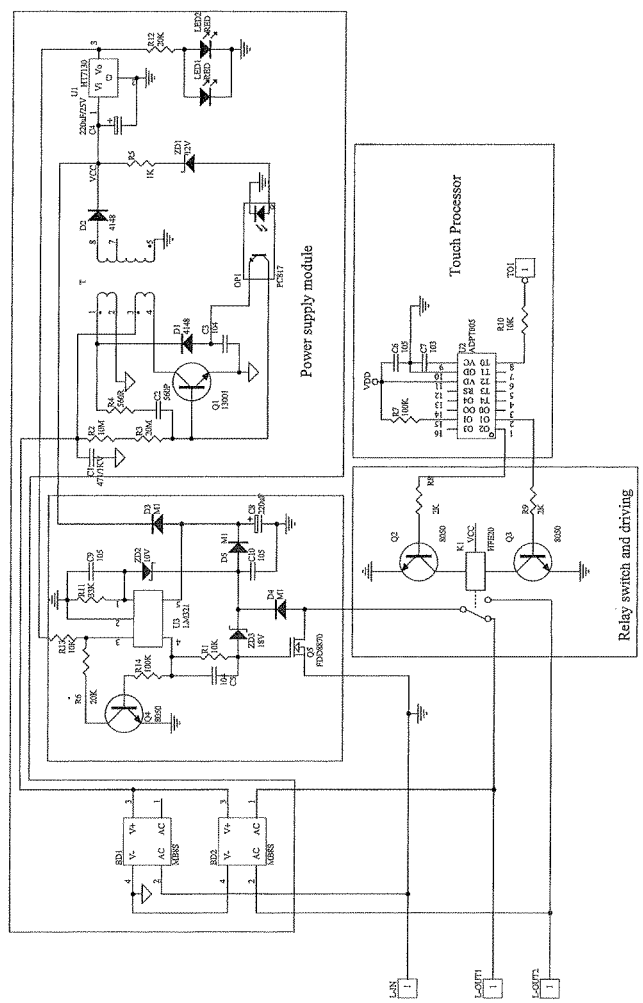
FIG. 16 is a schematic diagram of the circuit of the sixth example embodiment of the present invention.

Sixth example embodiment: as illustrated in FIG. 11 and FIG. 16, the implementation ways of the power supply module, the magnetic latching relay and the driving module are basically the same with that in the fifth example embodiment; the implementation way of the direct current feeder module is basically the same with that in the fourth example embodiment; and the connecting way of the touch sensing module is basically the same with that in the second example embodiment; therefore, those will not be repeatedly described here.

The application method of the example embodiment is the same with that of the fourth example embodiment and the fifth example embodiment.

What is claimed is:

1. An energy-saving electronic touch switch comprising:
   a touch sensing module;
   a power supply module; and
   a switch driving module,
   wherein the touch sensing module is used for receiving a touch sensing signal inputted by a capacitive touch switch, and for controlling an action of the switch driving module according to the touch sensing signal, so as to switch on a power supply circuit for a load;
   the power supply module feeds power to the touch sensing module;
   the power supply module receives power from a circuit that includes a rectifying bridge group that comprises three rectifying bridges (BD1, BD2 and BD3);
   the three rectifying bridges are connected in parallel to output to a first primary input terminal of a transformer T;
   positive output terminals of the rectifying bridge BD1, the rectifying bridge BD2 and the rectifying bridge BD3 are connected with a first terminal of a phototriode in an optocoupler OP0 after passing through a current limiting resistance R1, a resistance R2 and a resistance R3 which are connected in series;
   a common point of the current limiting resistance R1, the resistance R2 and the resistance R3 which are connected in series, and the first terminal of the phototriode in the optocoupler OP0 is connected with a base of an audion Q1;
   the audion Q1 is connected between a second primary input terminal of the transformer T and a ground in series;
   a filter capacitor C1 is connected onto a common terminal of the resistance R1 and the transformer T;
   a resistance R4 and a capacitor C2 are connected between the phototriode in the optocoupler OP0 and a secondary coil of the transformer T in series;
   the resistance R4 and the capacitor C2 form an RC (Resistance-Capacitance) oscillator; a second terminal of the phototriode in the optocoupler OP0 is grounded via a capacitance C3;
   the second terminal of the phototriode in the optocoupler OP0 is connected onto the secondary coil of the transformer T via a diode D1; and
   an output of a secondary main coil is outputted to the touch sensing module and a relay and driving module to feed power via a rectifying diode D2 and a diode D4.

2. The energy-saving electronic touch switch according to claim 1, wherein the switch driving module comprises magnetic latching relays and switch driving elements, and the touch sensing module controls the switching on and off of the switch driving elements.

3. The energy-saving electronic touch switch according to claim 2, wherein the quantity of the switch driving elements is twice of that of the magnetic latching relays; two switch driving elements are respectively connected onto the two control terminals of one magnetic latching relay; and the switch driving elements control the magnetic latching relays to work.

4. The energy-saving electronic touch switch according to claim 1, further comprising load detecting modules, wherein the load detecting module switches detect the voltages outputted by the switch driving module and feed back to the touch sensing module; more than one load detecting module is arranged; and each load detecting module detects the voltage outputted by one switch driving module and feeds back to the touch sensing module.

5. The energy-saving electronic touch switch according to claim 4, wherein the load detecting module employs divider resistances that are connected in series; one terminal of the divider resistance is connected with the output terminal of the switch driving module; the other terminal of the divider resistance is grounded; and the common terminal of the divider resistance is connected with the touch sensing module.

6. The energy-saving electronic touch switch according to claim 1, further comprising a feeder unit, wherein the feeder unit comprises a voltage stabilizing diode and a rectifying unit; the voltage stabilizing diode is connected onto the control terminal of a bidirectional triode thyristor and outputs to the rectifying unit, and the rectifying unit after rectifying outputs to the power supply module.

7. The energy-saving electronic touch switch according to claim 6, comprising an operational amplifier U3, a switching tube Q3 and an audion Q4, wherein the output terminal of the power supply module is connected with the inverting input terminal of the operational amplifier U3; the non-inverting input terminal of the operational amplifier U3 is grounded via a resistance R13; the output terminal of the operational amplifier U3 is connected onto the control terminal of the switching tube Q3; the switching tube Q3 is connected with a live wire of commercial power in series; the external side terminal of the switching tube Q3 is grounded; the output terminal of the operational amplifier U3 is connected with a base of the audion Q4 via a resistance R10; the audion Q4 is connected onto the inverting input terminal of the operational amplifier U3 via a resistance R17; a relay switch and driving module is connected onto the input terminal of a voltage regulator chip U2 via a diode D5, a diode D4 and a diode D3 successively connected in series; a feeder filter capacitor C10 and a feeder filter capacitor C11 are respectively connected between the two terminals of the diode D4 and the ground; a voltage stabilizing diode ZD3 is connected between the common terminal of the diode D5 and the diode D4 and the control terminal of the switching tube Q3; and a voltage stabilizing diode ZD2 is connected between the common terminal of the diode D5 and the diode D4 and the non-inverting input terminal of the operational amplifier U3.

8. The energy-saving electronic touch switch according to claim 1, further comprising a battery module, wherein the power supply module can charge the battery module and the battery module can feed power to the relay and driving module and the touch sensing module.

9. The energy-saving electronic touch switch according to claim 8, wherein the power supply module further comprises a voltage detecting chip; the voltage detecting chip detects the voltage of the battery module and outputs a detection result to the touch sensing module.

10. The energy-saving electronic touch switch according to claim 1, wherein the output of the secondary main coil of the transformer T is connected with a resistance R5, a voltage stabilizing diode ZD1 and a light emitting diode of an optocoupler OP0 that are connected in series.

11. The energy-saving electronic touch switch according to claim 1, wherein the power supply module further comprises a feedback unit; the feedback unit comprises an optocoupler and a voltage stabilizing diode; the voltage stabilizing diode is connected onto a second coil of the transformer T to sample the output voltage of the secondary coil of the transformer T and output a sampling result to a light emitting diode in the optocoupler; and a phototriode in the optocoupler outputs to a control terminal of a switching tube so as to control switching on and off of the switching tube.

12. The energy-saving electronic touch switch according to claim 1, further comprising a state indicating module used for indicating work of the power supply module, wherein the state indicating module is connected with the output terminal of the power supply module.

13. The energy-saving electronic touch switch according to claim 12, wherein the state indicating module of the touch switch comprises three red LEDs (Light Emitting Diodes) and three white LEDs (Light Emitting Diodes), and the six LEDs (Light Emitting Diodes) are respectively connected onto the output terminal of the touch sensing module.

14. An energy-saving electronic touch switch comprising:
a touch sensing module;
a power supply module; and
a switch driving module,
wherein the touch sensing module is used for receiving a touch sensing signal inputted by a capacitive touch switch, and for controlling an action of the switch driving module according to the touch sensing signal, so as to switch on a power supply circuit for a load;
the power supply module feeds power to the touch sensing module;
the power supply module receives power from a circuit that includes a rectifying bridge group that comprises two rectifying bridges (BD1 and BD2);
the two rectifying bridges are connected in parallel to output to a first primary input terminal of a transformer T;
positive output terminals of the rectifying bridge BD1 and the rectifying bridge BD2 are connected with a first terminal of a phototriode in an optocoupler OP0 after passing through a current limiting resistance R1, a resistance R2 and a resistance R3 which are connected in series;
a common point of the current limiting resistance R1, the resistance R2 and the resistance R3 which are connected in series, and the first terminal of the phototriode in the optocoupler OP0 is connected with a base of an audion Q1;
the audion Q1 is connected between a second primary input terminal of the transformer T and a ground in series;
a filter capacitor C1 is connected onto a common terminal of the resistance R1 and the transformer T;
a resistance R4 and a capacitor C2 are connected between the phototriode in the optocoupler OP0 and a secondary coil of the transformer T in series;
the resistance R4 and the capacitor C2 form an RC (Resistance-Capacitance) oscillator;
a second terminal of the phototriode in the optocoupler OP0 is grounded via a capacitance C3;
the second terminal of the phototriode in the optocoupler OP0 is connected onto the secondary coil of the transformer T via a diode D1; and
an output of a secondary main coil is outputted to the touch sensing module and a relay and driving module to feed power via a rectifying diode D2 and a diode D4.

15. The energy-saving electronic touch switch according to claim 14, wherein the switch driving module comprises magnetic latching relays and switch driving elements, and the touch sensing module controls the switching on and off of the switch driving elements.

16. The energy-saving electronic touch switch according to claim 14, further comprising load detecting modules, wherein the load detecting module switches detect the voltages outputted by the switch driving module and feed back to the touch sensing module; more than one load detecting module is arranged; and each load detecting module detects the voltage outputted by one switch driving module and feeds back to the touch sensing module.

17. The energy-saving electronic touch switch according to claim 14, further comprising a feeder unit, wherein the feeder unit comprises a voltage stabilizing diode and a rectifying unit; the voltage stabilizing diode is connected onto the control terminal of a bidirectional triode thyristor and outputs to the rectifying unit, and the rectifying unit after rectifying outputs to the power supply module.

18. The energy-saving electronic touch switch according to claim 14, further comprising a battery module, wherein the power supply module can charge the battery module and the battery module can feed power to the relay and driving module and the touch sensing module.

19. The energy-saving electronic touch switch according to claim 14, further comprising a state indicating module used for indicating work of the power supply module, wherein the state indicating module is connected with the output terminal of the power supply module.

\* \* \* \* \*